US012684851B2

(12) United States Patent     (10) Patent No.:     US 12,684,851 B2
Lin et al.                        (45) Date of Patent:        Jul. 14, 2026

(54) SEMICONDUCTOR STRUCTURE

(71) Applicant: Taiwan Semiconductor Manufacturing Company, Ltd., Hsinchu (TW)

(72) Inventors: Meng-Yu Lin, New Taipei City (TW); Chun-Fu Cheng, Zhubei City (TW); Hsiang-Hung Huang, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 909 days.

(21) Appl. No.: 17/896,353

(22) Filed: Aug. 26, 2022

(65) Prior Publication Data

US 2024/0072136 A1     Feb. 29, 2024

(51) Int. Cl.
| | |
|---|---|
| *H10D 64/23* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ......... *H10D 64/258* (2025.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 64/01* (2025.01); *H10D 84/0167* (2025.01); *H10D 84/017* (2025.01);

(Continued)

(58) Field of Classification Search
CPC .... H10D 64/258; H10D 30/014; H10D 30/43; H10D 30/6729; H10D 30/6735; H10D 30/6757; H10D 62/121; H10D 62/151; H10D 64/01; H10D 84/0167; H10D 84/017; H10D 84/0186; H10D 84/038; H10D 84/85; H10D 84/83–859; H10B 10/125
See application file for complete search history.

(56) References Cited

U.S. PATENT DOCUMENTS 9,209,247 B2   12/2015   Colinge et al.
9,236,267 B2   1/2016    De et al.
                         (Continued)

*Primary Examiner* — Christine S. Kim
*Assistant Examiner* — Nathalie R Fayette
(74) *Attorney, Agent, or Firm* — Birch, Stewart, Kolasch & Birch, LLP

(57)                ABSTRACT

A semiconductor structure includes a first transistor, a second transistor, a metal rail, and a first source/drain contact and a second source/drain contact. The first transistor has a gate structure, a first source/drain feature, and a second source/drain feature. The first source/drain feature and the second source/drain feature are on opposite sides of the gate structure. The second transistor has the gate structure, a third source/drain feature directly over the first source/drain feature, and a fourth source/drain feature directly over the second source/drain feature. The metal rail extends in an X-direction and adjacent to the gate structure in a Y-direction. The first source/drain contact and the second source/drain contact each has an L-shape in a Y-Z cross-sectional view. The first source/drain contact electrically connects the first source/drain feature to the metal rail. The second source/drain contact electrically connects the fourth source/drain feature to the metal rail.

20 Claims, 38 Drawing Sheets

(51) Int. Cl.

| | |
|---|---|
| *H10D 62/13* | (2025.01) |
| *H10D 64/01* | (2025.01) |
| *H10D 84/01* | (2026.01) |
| *H10D 84/03* | (2025.01) |
| *H10D 84/85* | (2025.01) |
| *H10B 10/00* | (2023.01) |

(52) U.S. Cl.
CPC ....... *H10D 84/0186* (2025.01); *H10D 84/038* (2025.01); *H10D 84/85* (2025.01); *H10B 10/125* (2023.02)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2019/0288004 A1* | 9/2019 | Smith ................... | H10D 89/10 |

* cited by examiner 108C
106A
108C
106A
108C
106A
108B
106B
108B
106A
108A
106A
108A
106A
108A
106A

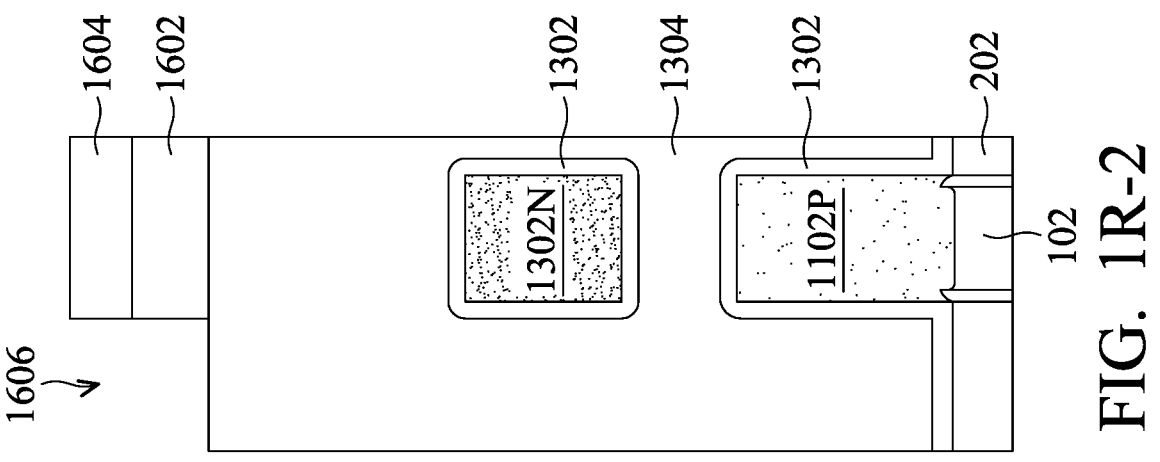
FIG. 1R-2
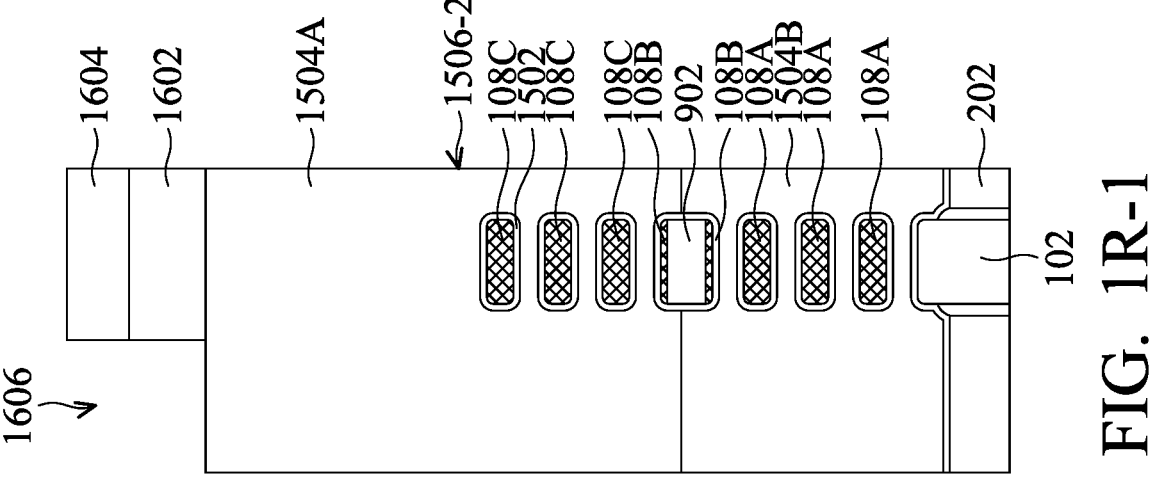
FIG. 1R-1
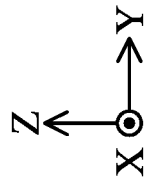

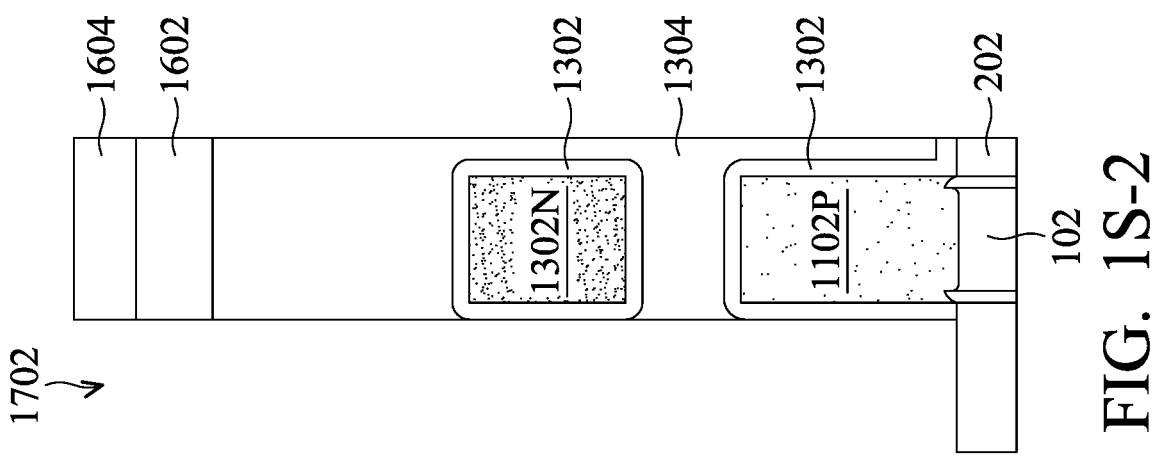
FIG. 1S-2
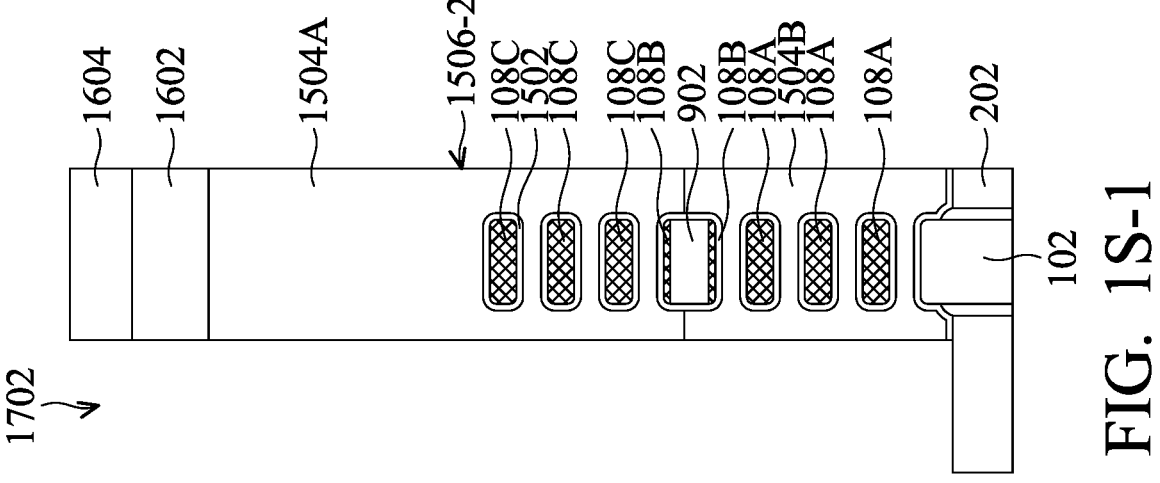
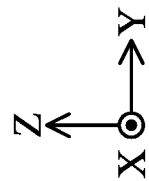
FIG. 1S-1

SEMICONDUCTOR STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce the chip footprint while maintaining reasonable processing margins.

As GAA devices continue to be developed, complementary metal-oxide-semiconductor field effect transistors (CMOSFET or CFET) has been provided due to their high noise immunity and low static power consumption. However, although existing technologies for fabricating CFETs have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1D, 1E, 1F, 1G, 1H, 1I, 1J, 1K, 1L, 1M, 1N, 1O, 1P, and 1Q are X-Z cross-sectional views of the workpiece at various fabrication stages along a line A-A' of FIG. 1C, in accordance with some embodiments of the present disclosure.

FIGS. 1R-1, 1S-1, 1T-1, 1U-1, 1V-1, 1W-1, and 1X-1 are Y-Z cross-sectional views of the workpiece at various fabrication stages along a line A-A' of FIG. 1Q, in accordance with some embodiments of the present disclosure.

FIGS. 1R-2, 1S-2, 1T-2, 1U-2, 1V-2, 1W-2, and 1X-2 are Y-Z cross-sectional views of the workpiece at various fabrication stages along a line B-B' or a line C-C' of FIG. 1Q, in accordance with some embodiments of the present disclosure.

FIGS. 1Y-1, 1Z-1, 1ZA-1, 1ZB-1, 1ZC-1, 1ZD-1, 1ZE-1, 1ZF-1, and 1ZG-1 are Y-Z cross-sectional views of the workpiece at various fabrication stages along the line A-A' of FIG. 1Q, in accordance with some embodiments of the present disclosure.

FIGS. 1Y-2, 1Z-2, 1ZA-2, 1ZB-2, 1ZC-2, 1ZD-2, 1ZE-2, 1ZF-2, and 1ZG-2 are Y-Z cross-sectional views of the workpiece at various fabrication stages along the line B-B' of FIG. 1Q, in accordance with some embodiments of the present disclosure.

FIGS. 1Y-3, 1Z-3, 1ZA-3, 1ZB-3, 1ZC-3, 1ZD-3, 1ZE-3, 1ZF-3, and 1ZG-3 are Y-Z cross-sectional views of the workpiece at various fabrication stages along the line C-C' of FIG. 1Q, in accordance with some embodiments of the present disclosure.

DETAILED DESCRIPTION

Figure 1A:
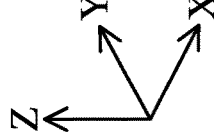
FIGS. 1A, 1B, and 1C are isometric views of a workpiece at various fabrication stages, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as three-dimensional complementary field effect transistors (CFETs) with gate-all-around (GAA) structures, in memory (e.g., SRAM) and/or standard logic cells of an integrated circuit (IC) structure. Generally, a CFET may include a n-type FET (NFET) and a p-type FET (PFET) disposed vertically with a plurality of vertically stacked sheets (e.g., nanosheets), wires (e.g., nanowires), or rods (e.g., nanorods) in a channel region of the CFET, thereby allowing better gate control, lowered leakage current, and improved scaling capability for various IC applications. While existing technologies for fabricating CFETs have been generally adequate for their intended applications, they have not been entirely satisfactory in all aspects.

The gate-all-around (GAA) structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including L-shape source/drain contacts and horizontal metal rail to connect source/drain features of NFET and PFET in the CFET to decrease parasitic capacitance and resistance. The details of the structure and fabrication methods of the present disclosure are described below in conjunction with the accompanying drawings, which illustrate the process of making CFET structures, according to some embodiments.

Figure 1B:
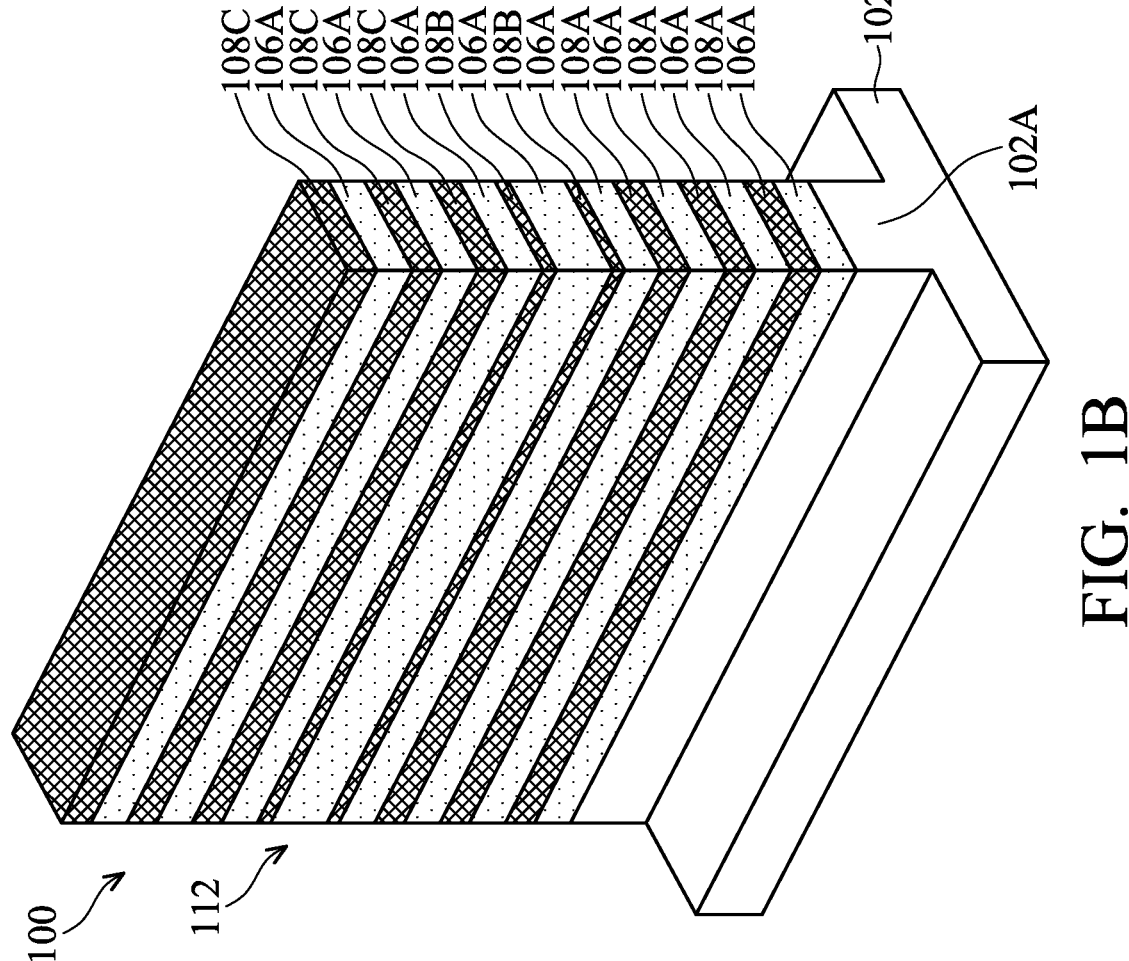
Figure 1B:
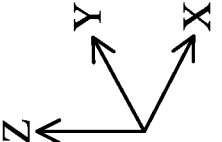
Figure 1C:
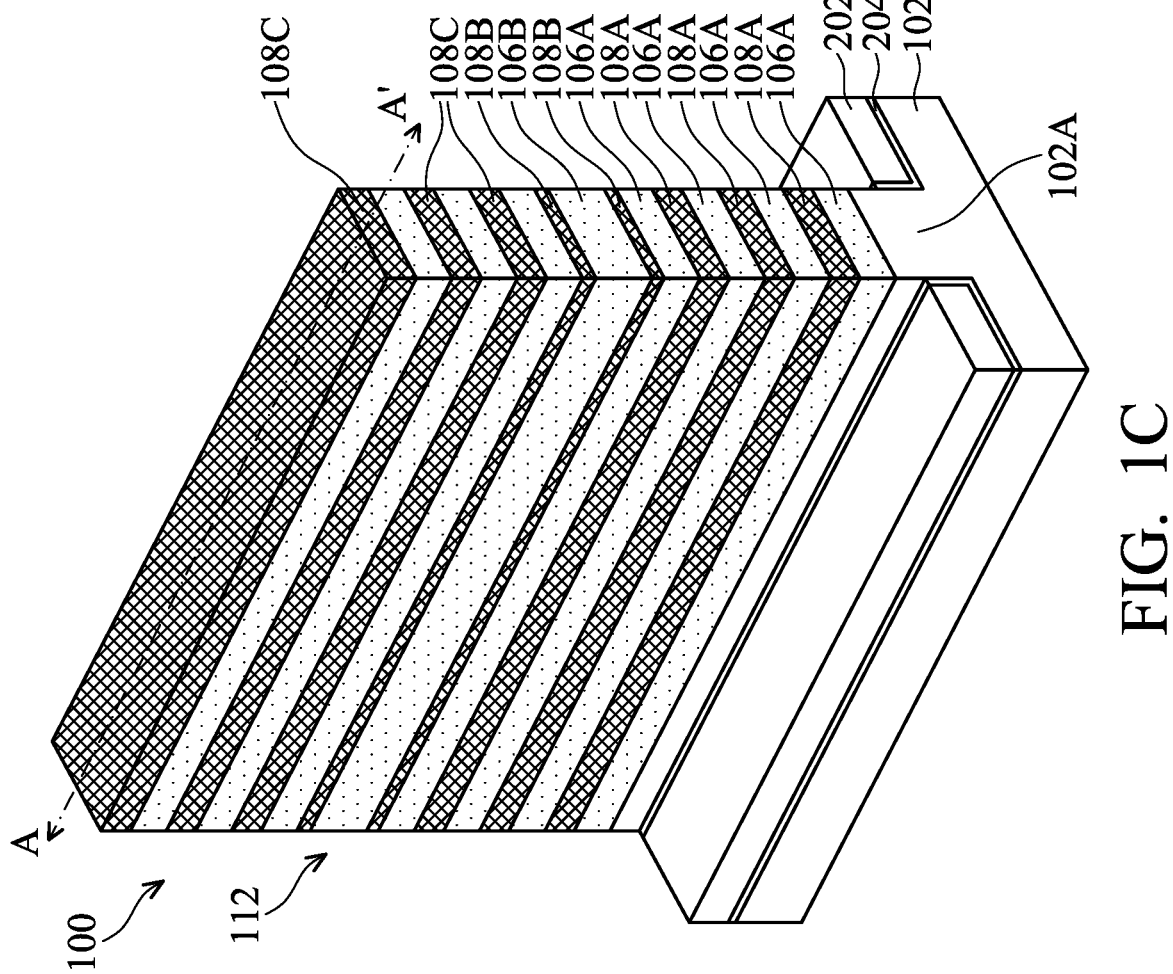
Figure 1C:
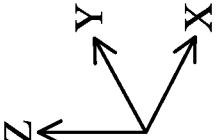

FIGS. 1A to 1C are isometric views of a workpiece 100 at various fabrication stages, in accordance with some embodiments of the present disclosure. Referring to FIG. 1A, a workpiece 100 is provided. The workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

The stack 104 includes semiconductor layers 106 (including semiconductor layers 106A and a semiconductor layer 106B) and 108 (including semiconductor layers 106A, semiconductor layers 106B, and semiconductor layers 106C), and the semiconductor layers 106 and 108 are alternately stacked in the Z-direction. As shown in FIG. 1A, a thickness of the semiconductor layer 106B is greater than a thickness of the semiconductor layers 106A and a thickness of the semiconductor layers 108. Furthermore, a thickness of the semiconductor layers 108B is less than a thickness of the semiconductor layers 108A and 108C and a thickness of the semiconductor layers 106. In some embodiments, a thickness of the semiconductor layer 106B is in a range from about 5 nm to about 25 nm. In some embodiments, a thickness of the semiconductor layers 108B is in a range from about 1 nm to about 5 nm.

The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers. The germanium concentration of the semiconductor layer 106B is greater than the germanium concentration of the semiconductor layers 106A. In some embodiments, the germanium concentration of the semiconductor layer 106B is greater than about 50%, and the germanium concentration of the semiconductor layers 106A is in a range from about 10% to about 35%.

In some embodiments, the semiconductor layers 106 and 108 are epitaxially grown over (on) the semiconductor substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104.

Figure 1D:
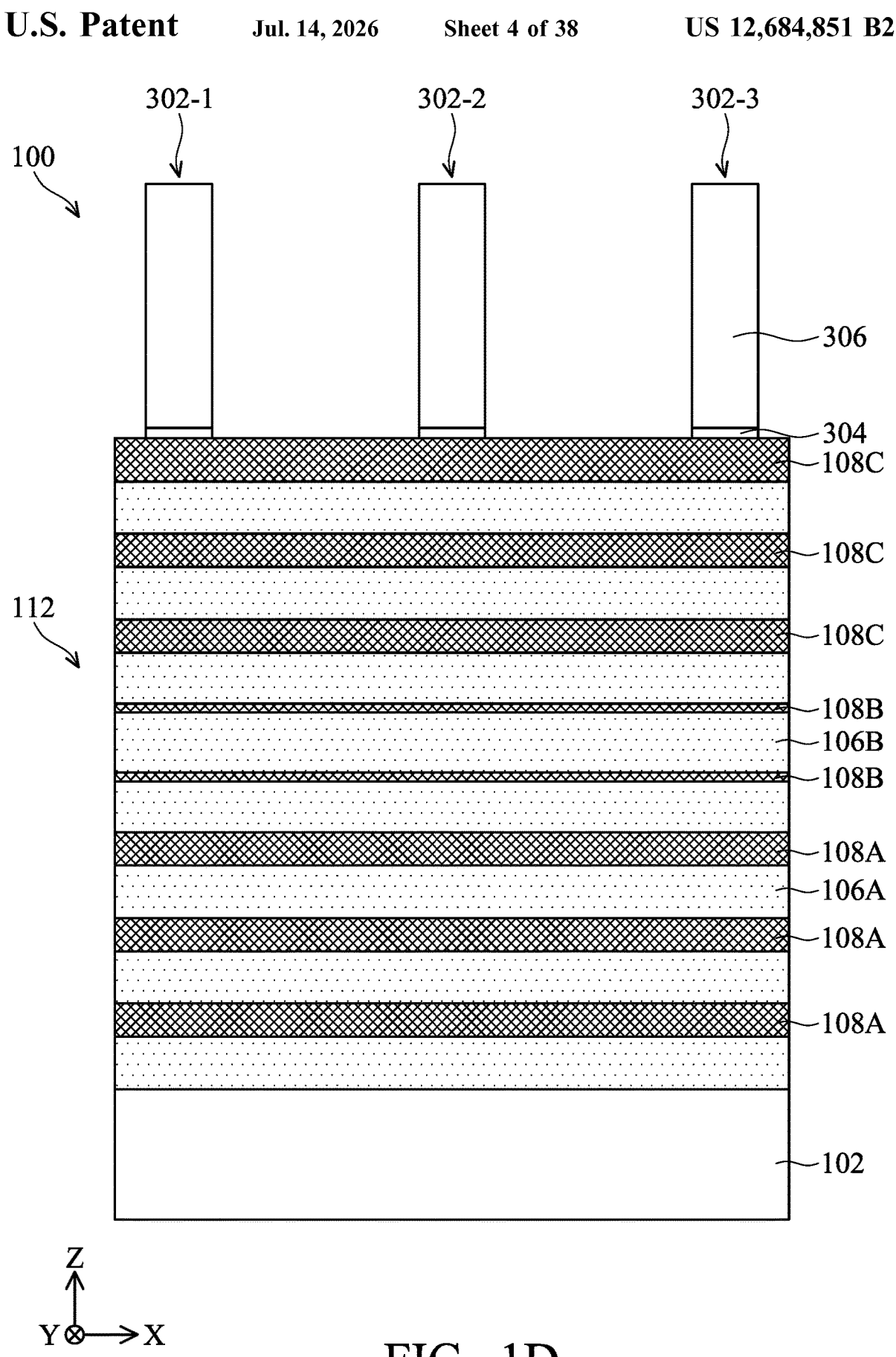
Figure 1E:
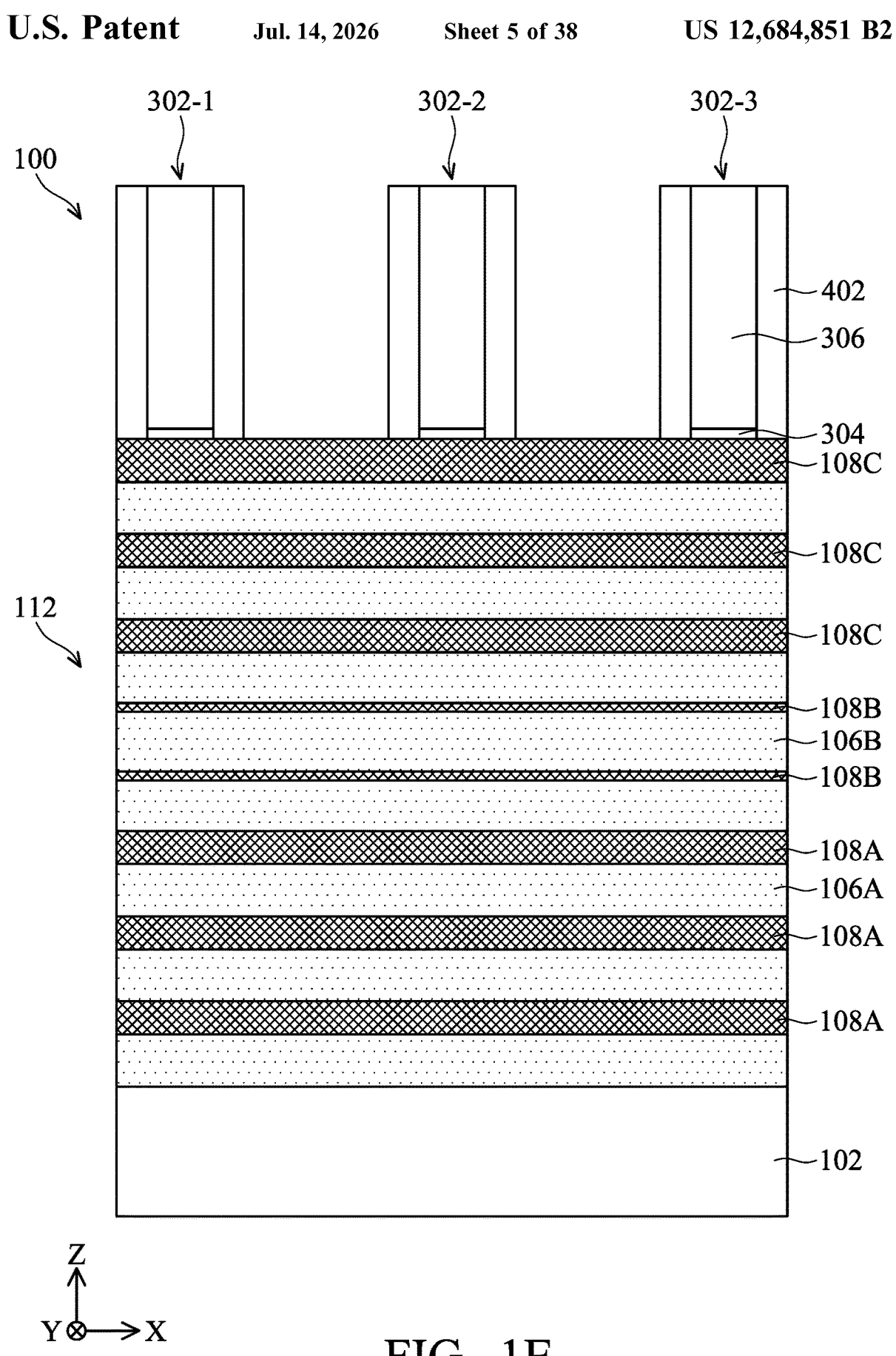
Figure 1F:
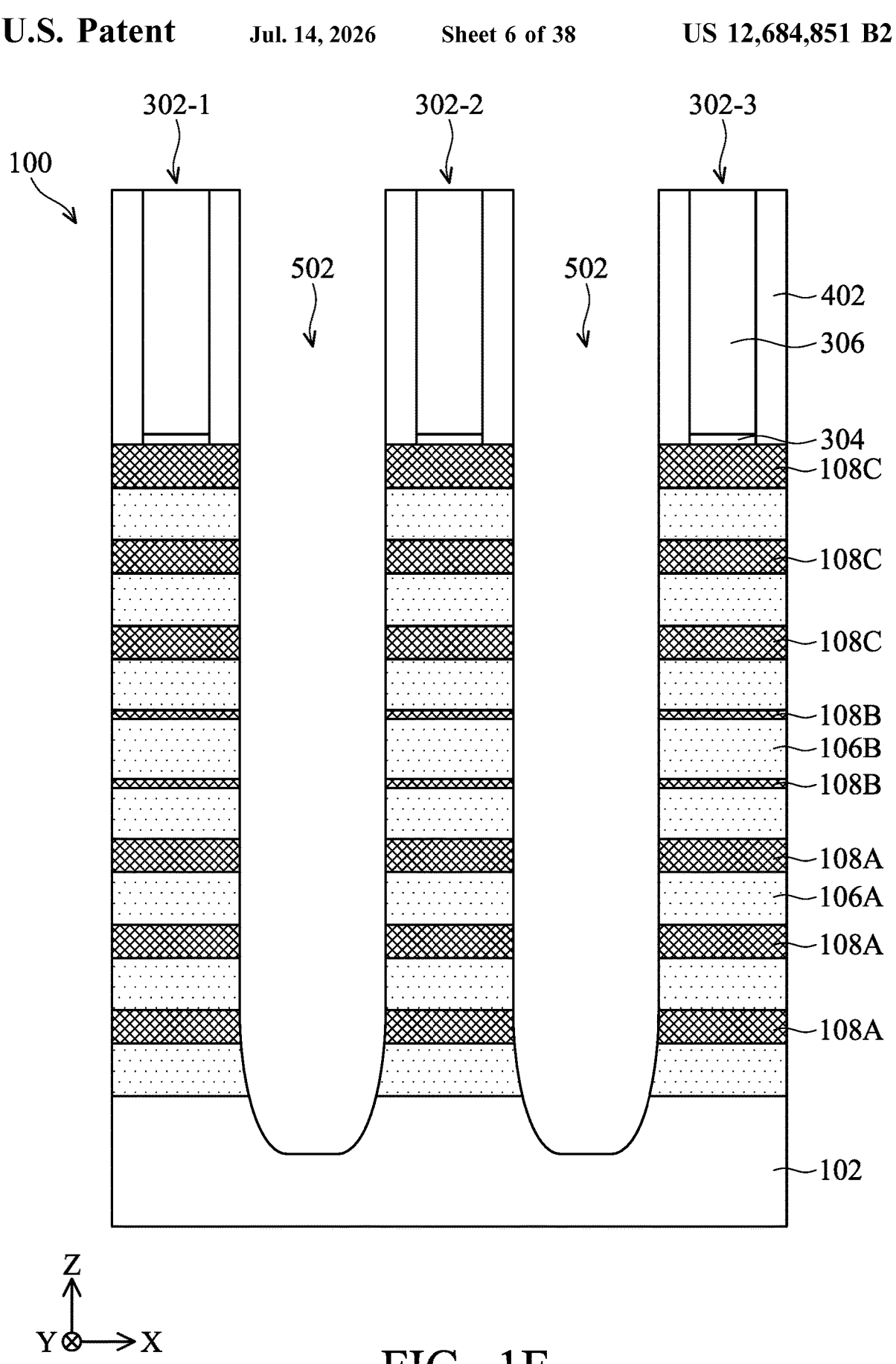
Figure 1G:
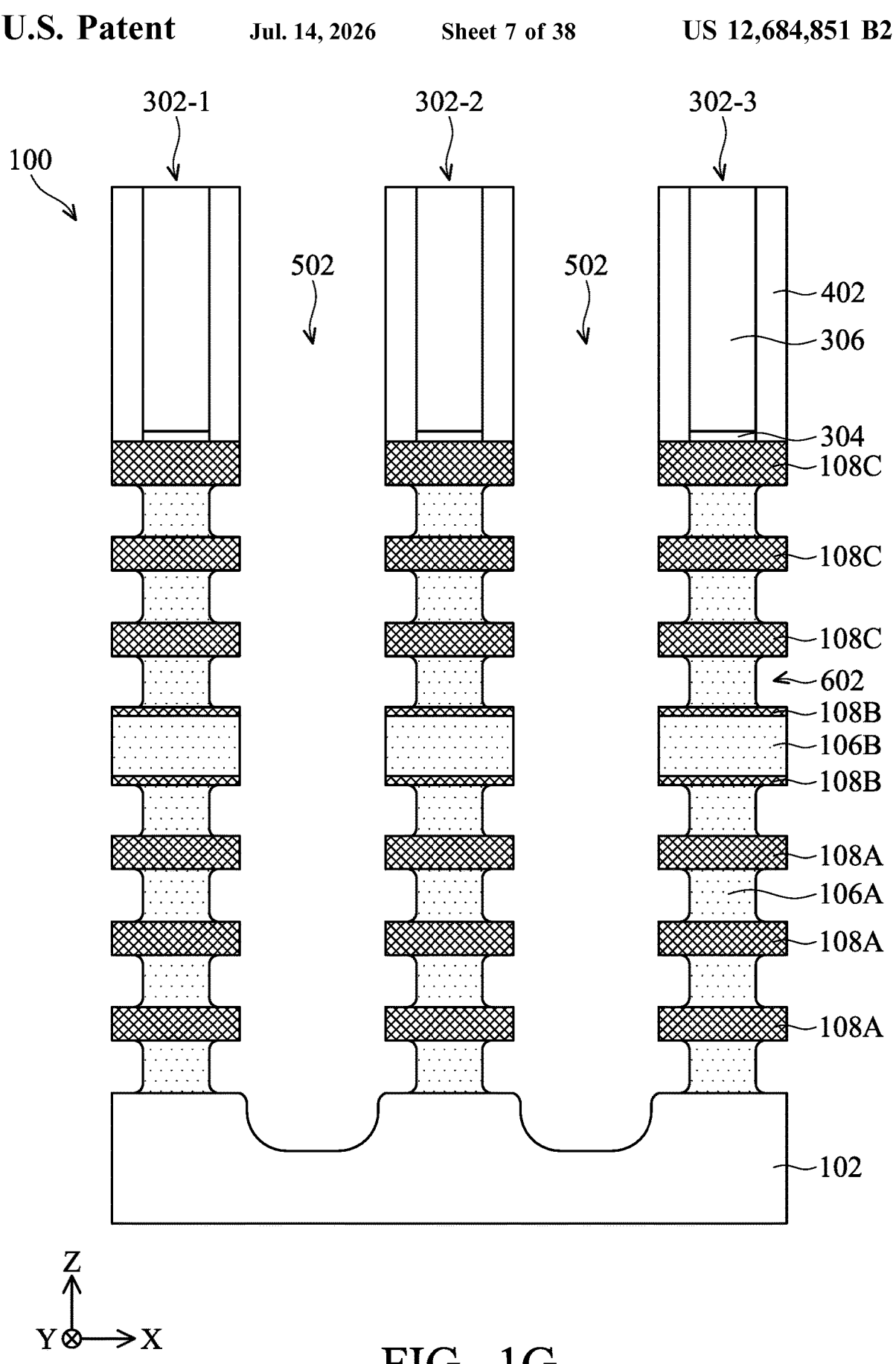
Figure 1H:
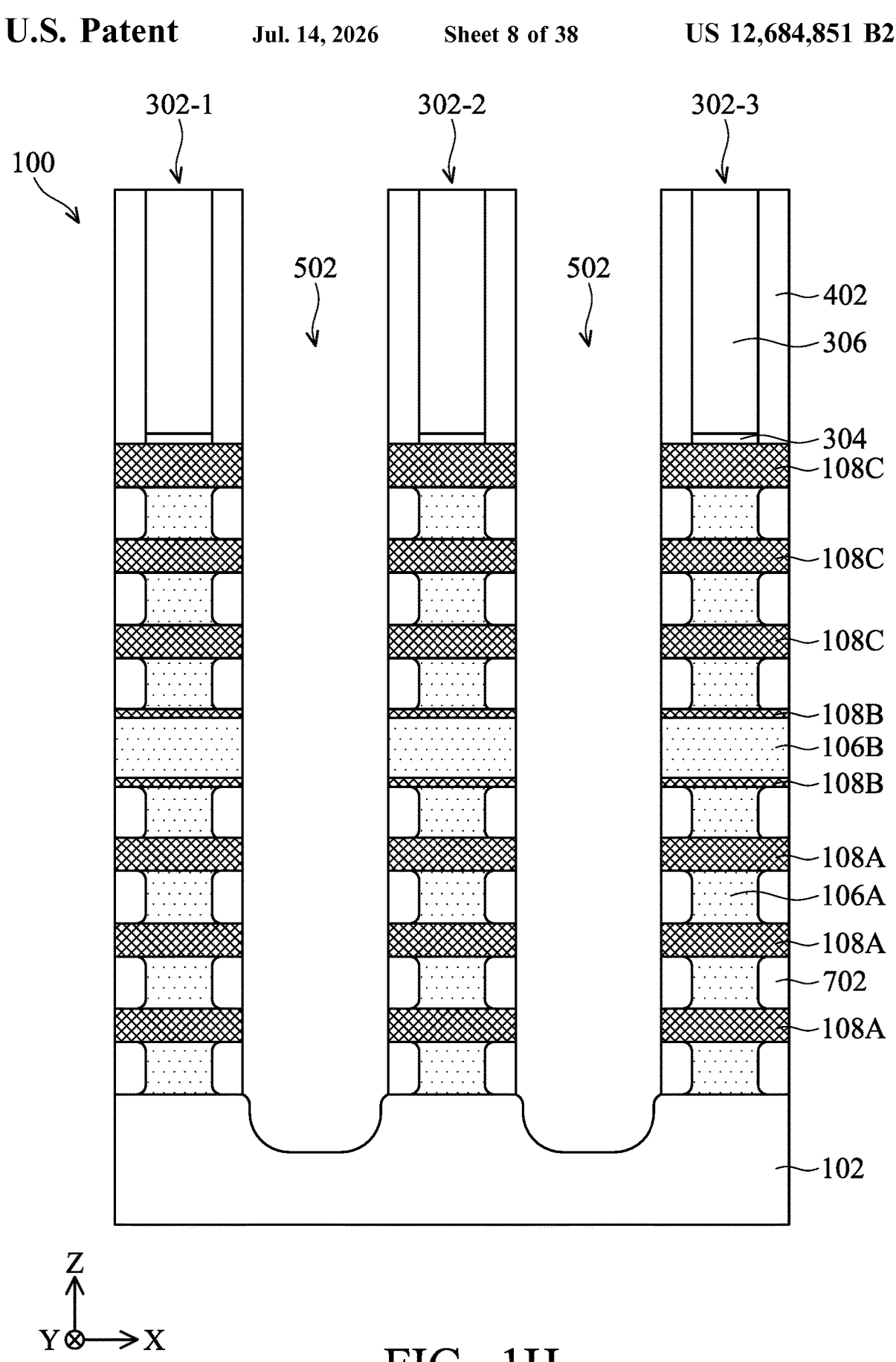
Figure 1I:
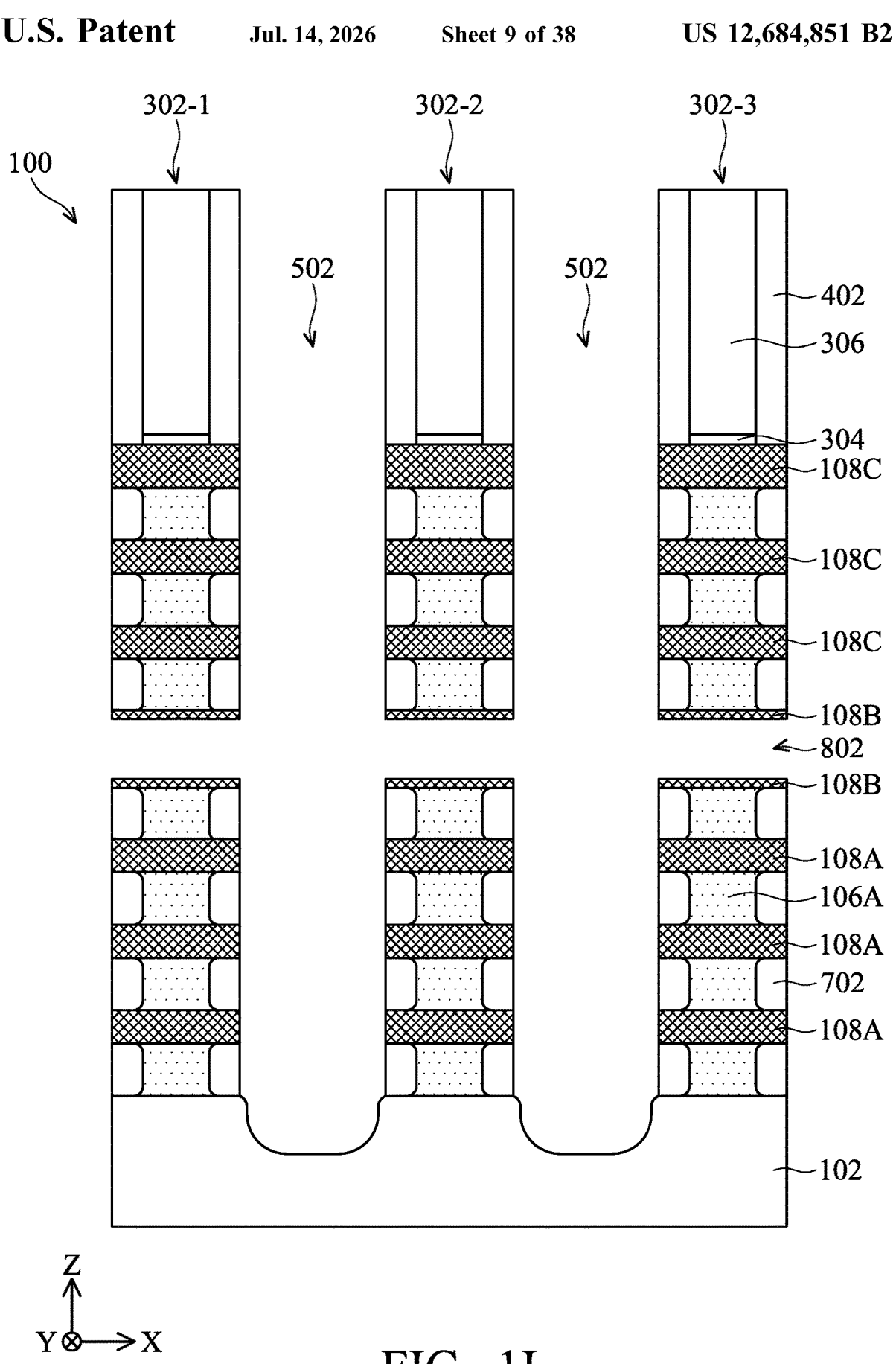
Figure 1J:
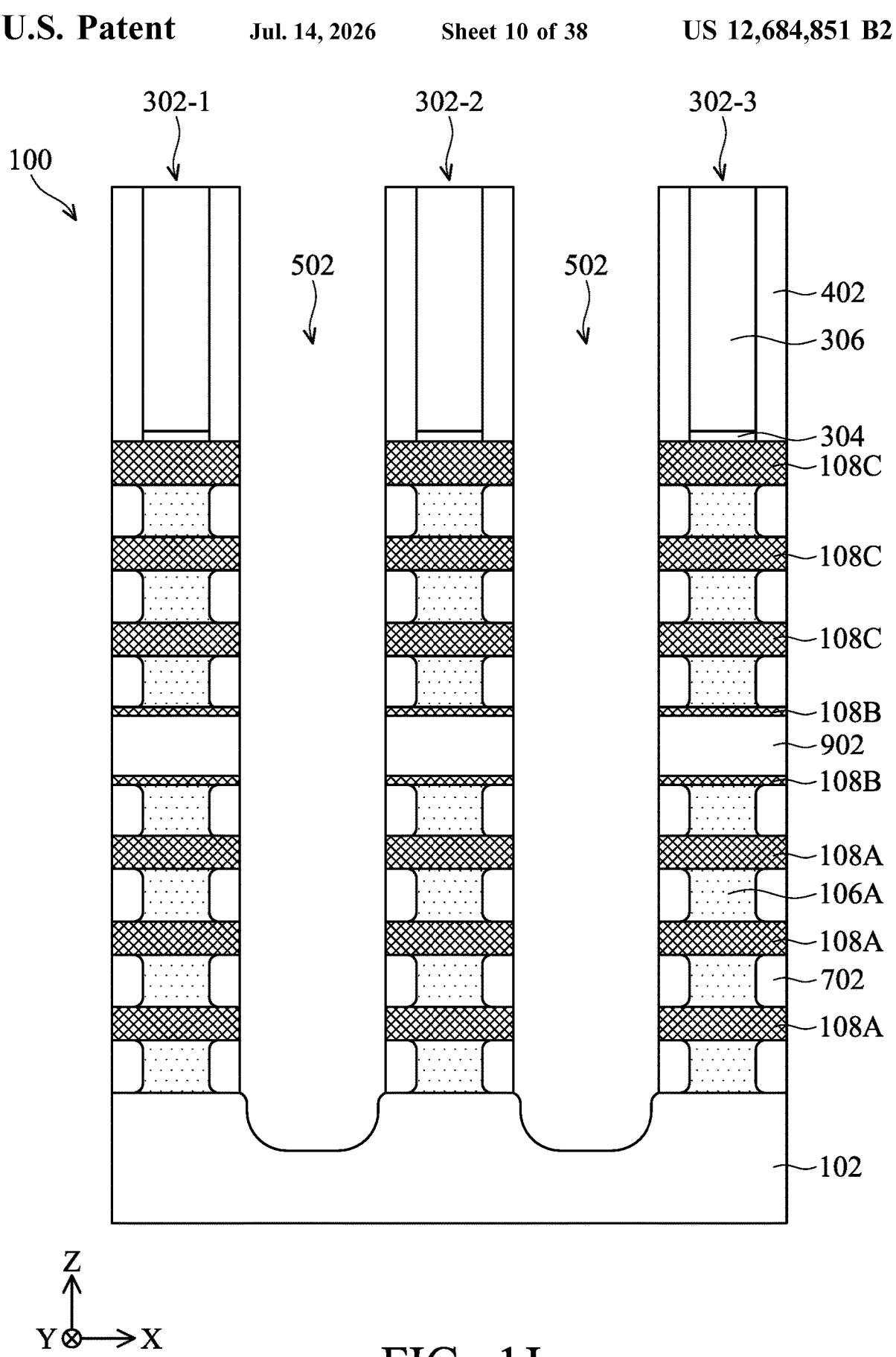
Figure 1K:
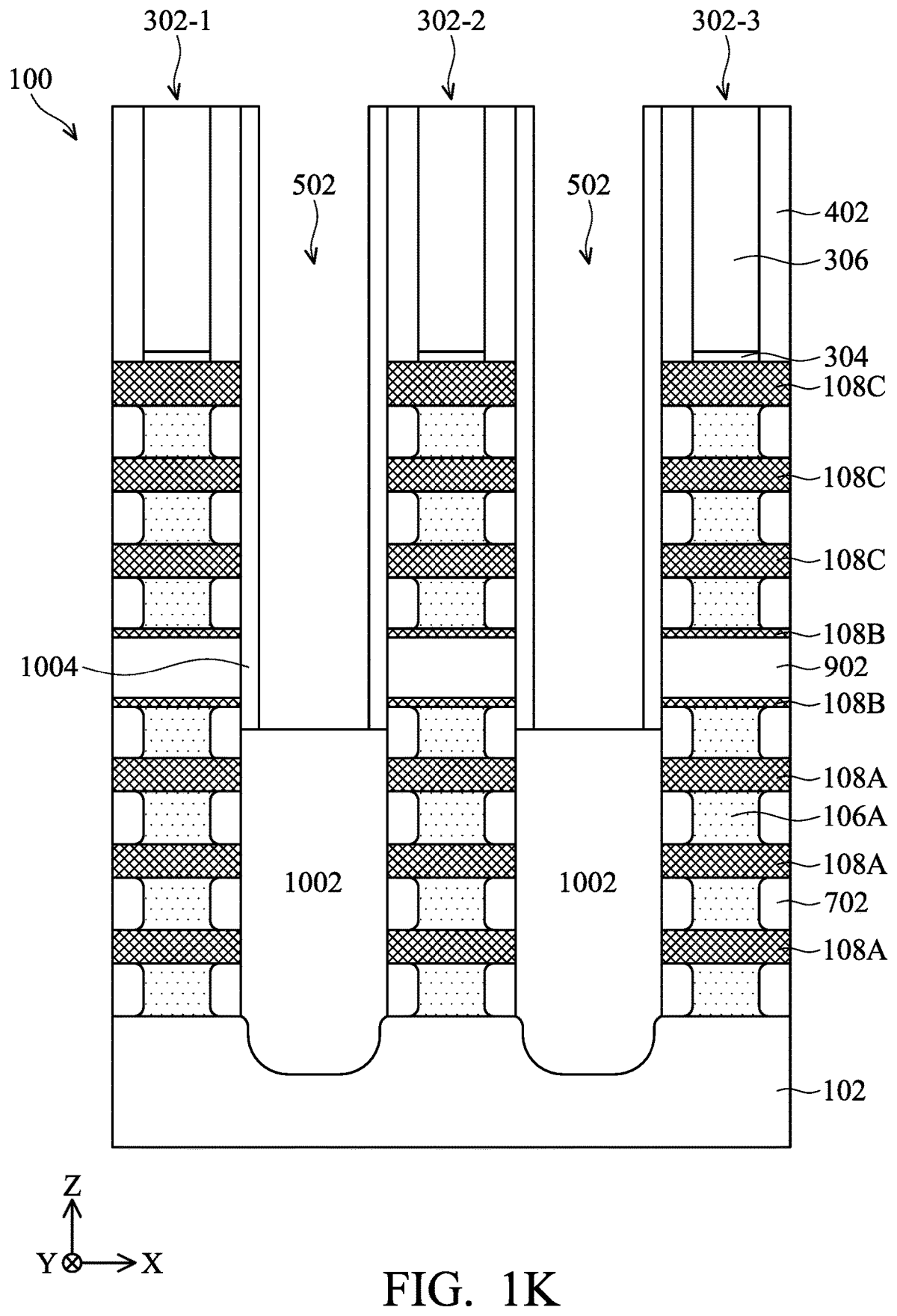
Figure 1L:
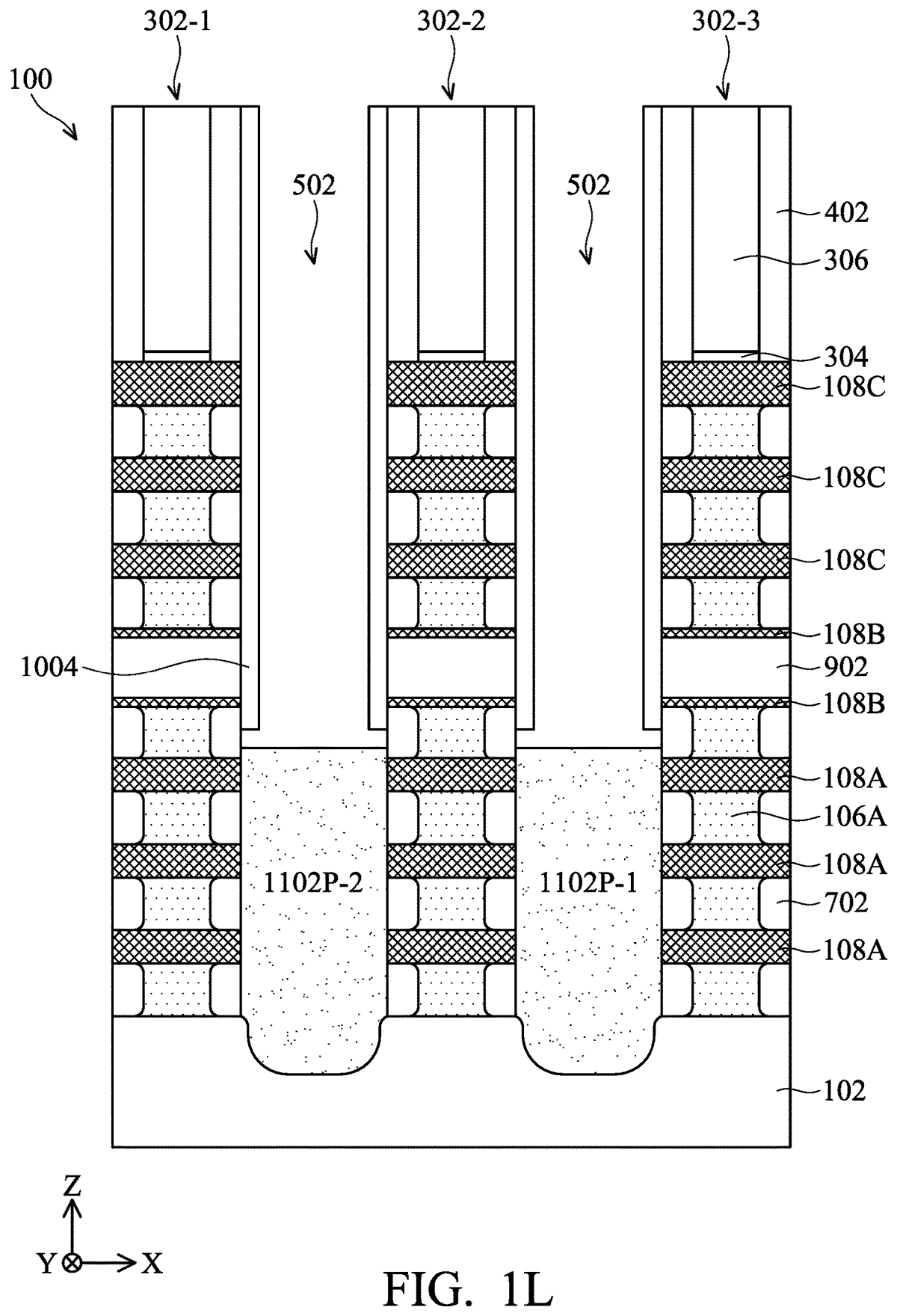
Figure 1M:
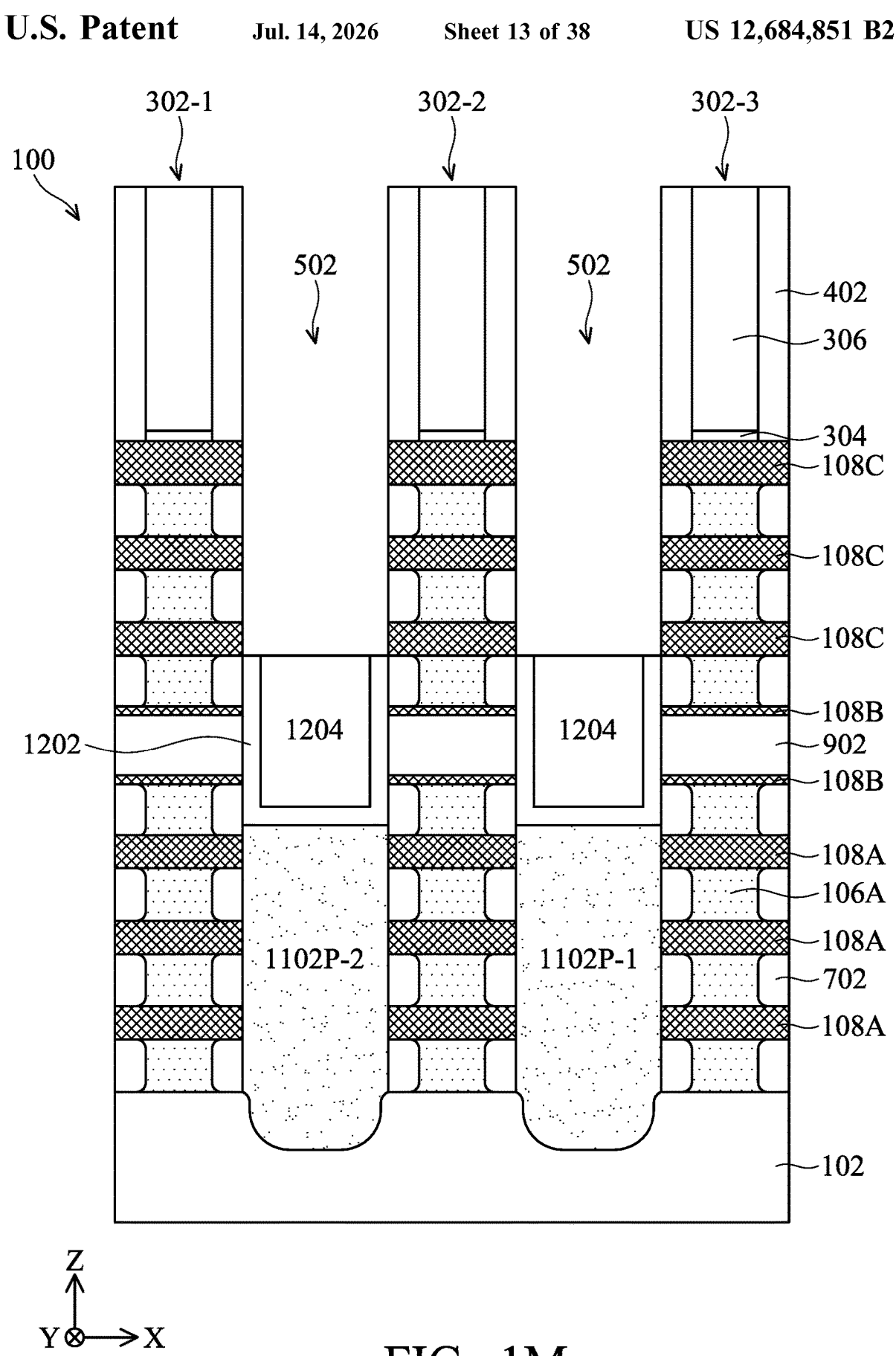
Figure 1N:
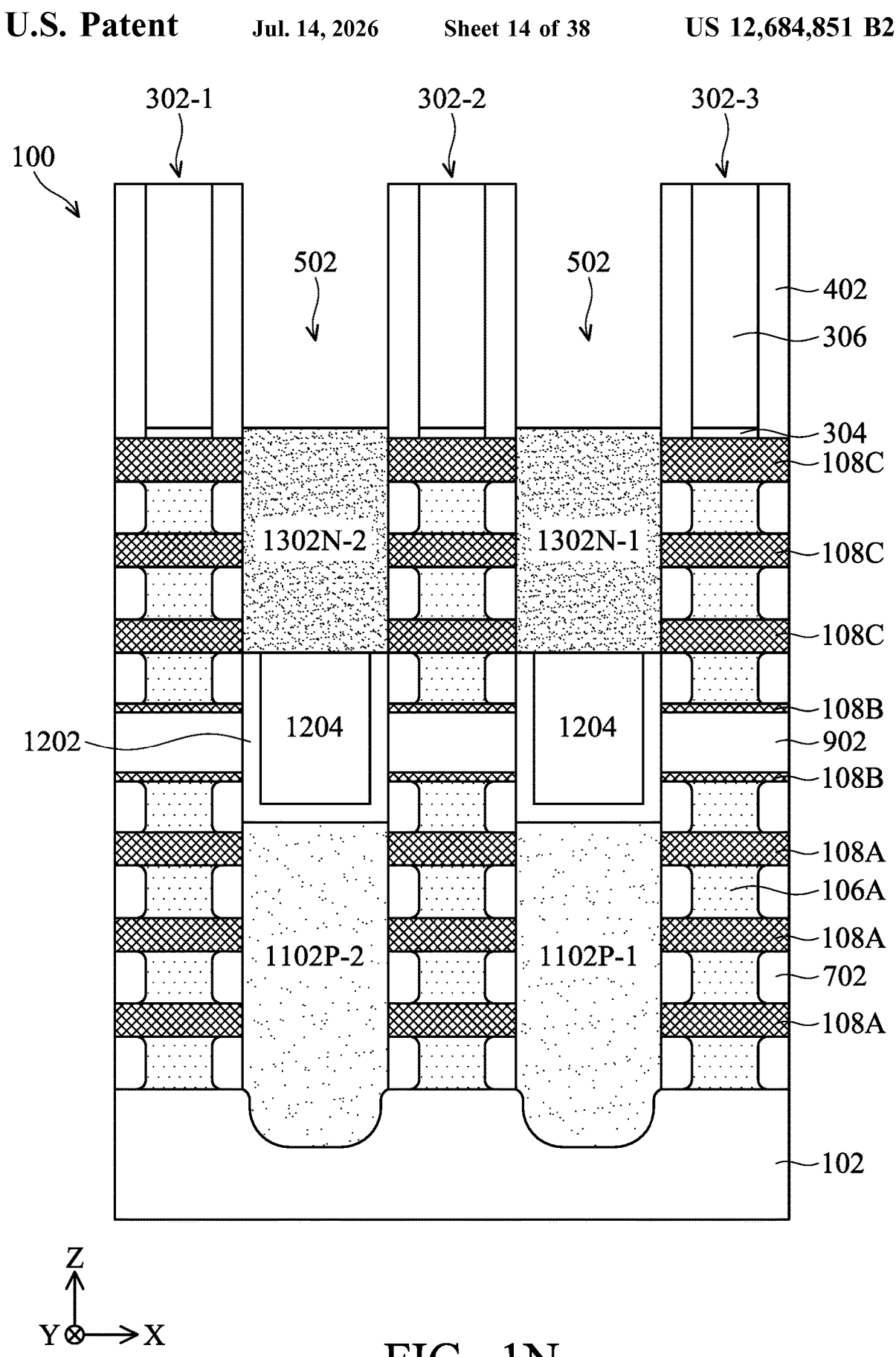
Figure 1O:
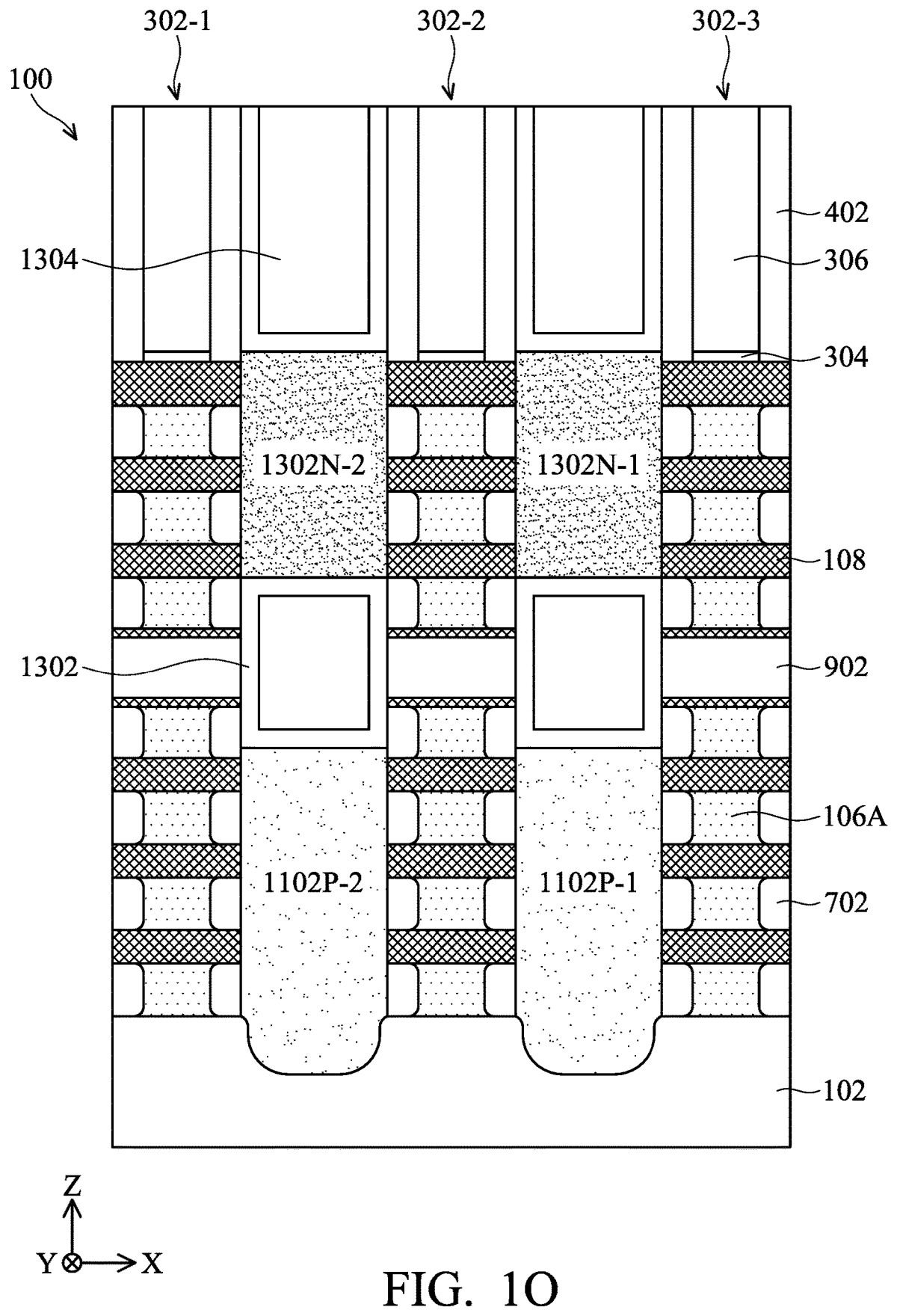
Figure 1P:
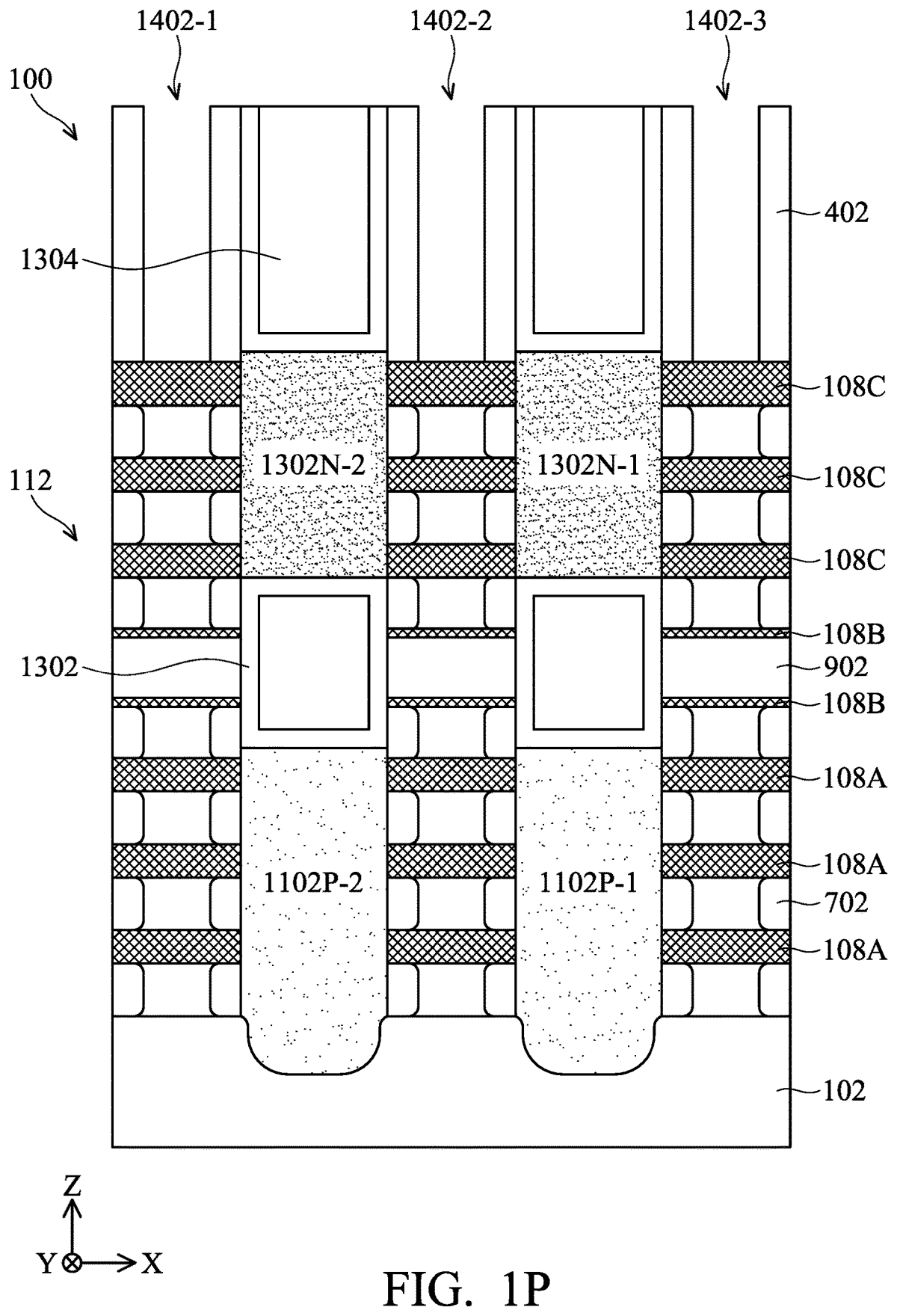
Figure 1Q:
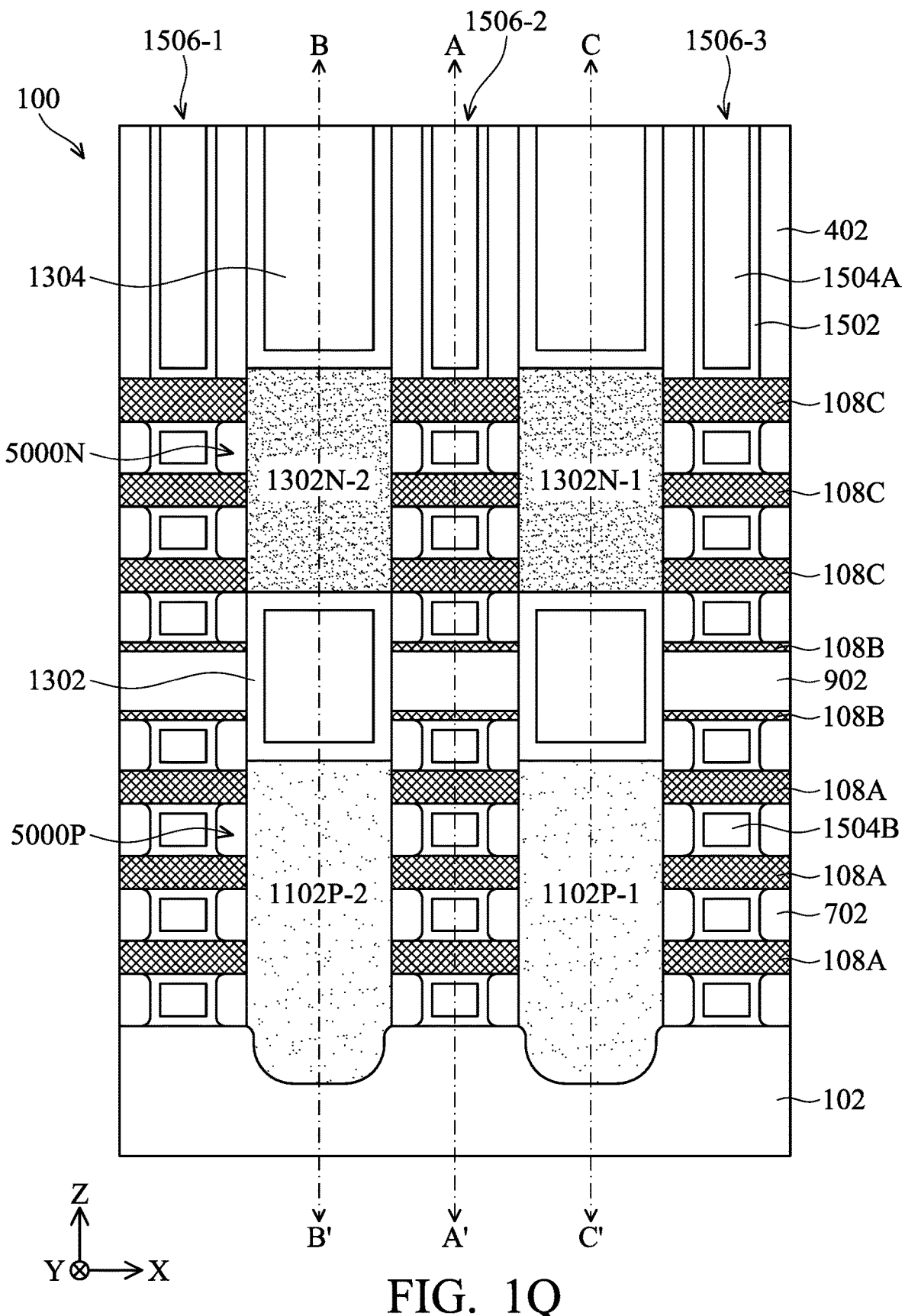
Figure 5:
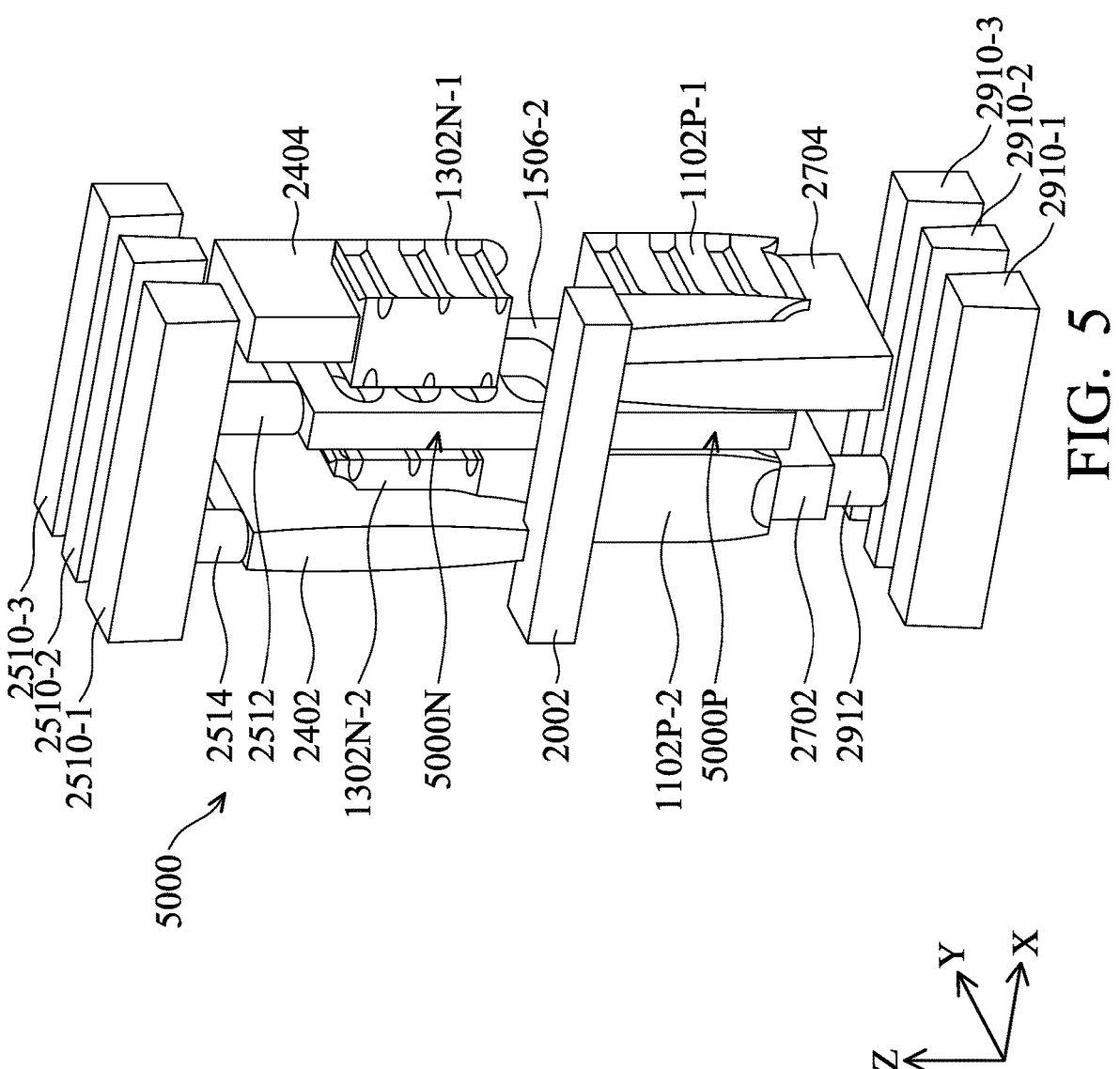
FIG. 5 is an isometric view of a CFET formed from the workpiece, in accordance with some embodiments of the present disclosure.

The three (3) semiconductor layers 108A are used for the p-type FET (PFET) of the CFET (e.g., a PFET 5000P of a CFET 5000 shown in FIGS. 1Q and 5) and the three (3) semiconductor layers 108C are used for the n-type FET (NFET) of the CFET (e.g., a NFET 5000N of a CFET 5000 shown in FIGS. 1Q and 5). It should be noted that eight (8) layers of the semiconductor layers 106 and eight (8) layers of the semiconductor layers 108 are alternately and vertically arranged (or stacked) as shown in FIG. 1A, which are for illustrative purposes only and not intended to be limiting beyond what is specifically recited in the claims. The number of the layers depends on the desired number of channels members for the semiconductor device.

Referring to FIG. 1B, the substrate 102 and the stack 104 are then patterned to form a fin 112 over the substrate 102. As shown in FIG. 1B, the fin 112 includes a base portion 102A formed from a portion of the substrate 102 and a stack portion formed from the stack 104 over the base portion. The fin 112 extends lengthwise in the X-direction and extends vertically in the Z-direction over the substrate 102. Although one fin 112A is formed herein, more fins may be formed, such as three or more fins.

The fin 112 may be patterned using suitable processes including double-patterning or multi-patterning processes. For example, in some embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin 112 by etching the stack 104 and the substrate 102. The etching process may include dry etching, wet etching, reactive ion etching (RIE), and/or other suitable processes.

Referring to FIG. 1C, isolation structures 202 are formed. After the fin 112 is formed, the isolation structures 202 are formed over the substrate 102. In some embodiments, the isolation structure 202 extends in the X-direction (not shown) and is arranged with the fin 112 in the Y-direction. In some other aspects, the isolation structure 202 is formed around the fin 112. The isolation structures 202 may also be referred to as shallow trench isolation (STI) feature. In some embodiments, a dielectric material for the isolation structures 202 is first deposited over the workpiece 100. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD, a subatmospheric CVD (SACVD), a flowable CVD (FCVD), an ALD, spin-on coating, and/or other suitable process. The deposited dielectric material is then thinned and planarized, for example by a chemical mechanical polishing (CMP) process. The planarized dielectric material is further recessed by a dry etching process, a wet etching process, and/or a combination thereof to form the isolation structures 202. As shown in FIG. 1C, the stack portions of the fins 112 rise above the isolation structures 202 while the base portion 102A are surrounded by the isolation structures 202. In other words, a top surface of the substrate 102 is higher than top surfaces of the isolation structures 202. In some embodiments, before the formation of the isolation structures 202, liner layers 204 are conformally deposited over the substrate 202 using ALD or CVD, as shown in FIG. 1C.

FIGS. 1D to 1Q are X-Z cross-sectional views of the workpiece 100 at various fabrication stages along a line A-A' of FIG. 1C, in accordance with some embodiments of the present disclosure. Referring to FIG. 1D, dummy gate structures 302 (including dummy gate structures 302-1 to 302-3) may be formed over the fin 112 and over the isolation structures 202 (not shown). The dummy gate structure 302 may be configured to extend along the Y-direction and wrap around a top surface and side surfaces of the fin 402. In some embodiments, to form the dummy gate structure 302, a dummy interfacial material of a dummy interfacial layer 304 is first formed over fin 402 and over the isolation structures 202. In some embodiments, the dummy interfacial layer 304 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of a dummy gate electrode 306 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD). After the formation of the dummy gate material and the dummy interfacial material, lithography and etching processes may be performed to remove portions of the dummy gate material and the dummy interfacial material, thereby forming the dummy gate structures 302 with dummy gate electrode 306 and the dummy interfacial layer 304. The dummy gate structures 302 may undergo a gate replacement process through subsequent processing to form metal gates, such as a high-k metal gate, as discussed in greater detail below.

FIG. 1D shows three dummy gate structures 302-1 to 302-3. In some embodiments, the dummy gate structures 302-1 to 302-3 may be used as dummy gate structures for three CFETs sharing source/drain regions. In other embodiments, the dummy gate structures 302-1 and 302-3 may also undergo a gate replacement process to form dielectric based gates that electrically isolate a CFET formed by the dummy gate structure 302-2 from neighboring CFETs or devices.

Referring to FIG. 1E, gate spacers 402 are formed on sidewalls of the dummy gate structures 302, over a top surface of the fin 112. The gate spacers 402 may include silicon nitride ($Si_3N_4$), silicon oxide ($SiO_2$), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof. The gate spacers 402 may include a single layer or a multi-layer structure. In some embodiments, the gate spacers 702 may be formed by depositing a spacer layer (containing the dielectric material) over the isolation structures 202, the fin 112, and dummy gate structures 302-1, 302-2, and 302-3, followed by an anisotropic etching process to remove top portions of the spacer layer from the top surfaces of the isolation structures 202, the fin 112, and dummy gate structures 302-1, 302-2, and 302-3. After the etching process, portions of the spacer layer on the sidewall surfaces of the fin 112 and the dummy gate structures 302-1, 302-2, and 302-3 substantially remain and become the gate spacers 402. In some embodiments, the anisotropic etching process is a dry (e.g., plasma) etching process. Additionally or alternatively, the formation of the gate spacers 402 may also involve chemical oxidation, thermal oxidation, ALD, CVD, and/or other suitable methods. The gate spacers 402 may also be interchangeably referred to as the top spacers.

Referring to FIG. 1F, the fin 112 is recessed to form source/drain trenches 502 in the fin 112 (or passing through the semiconductor layers 106 and 108). Specifically, the source/drain trenches 502 may be formed by performing one or more etching processes to remove portions of the semiconductor layers 106, the semiconductor layers 108, and the substrate 102 that do not vertically overlap or be covered by the dummy gate structures 302 and the gate spacers 402. In some embodiments, a single etchant may be used to remove the semiconductor layers 106, the semiconductor layers 108, and the substrate 102, whereas in other embodiments, multiple etchants may be used to perform the etching process.

Referring to FIG. 1G, side portions of the semiconductor layers 106A are removed via a selective etching process, and the semiconductor layer 106B is not removed. Specifically, the selective etching process is performed that selectively etches the side portions of the semiconductor layers 106A below the gate spacers 402 through the source/drain trenches 502, with minimal (or no) etching of the semiconductor layer 106B and the semiconductor layers 108, such that gaps 602 are formed between the semiconductor layers 108 as well as between the semiconductor layers 108 and the substrate 102, below the gate spacers 402. The etching process is configured to laterally etch (e.g., along the X-direction) the semiconductor layers 106A below the gate spacers 402. The selective etching process is a dry etching process, a wet etching process, other suitable etching process, or combinations thereof.

Referring to FIG. 1H, inner spacers 702 are formed to fill the gaps 602. In some embodiments, sidewalls of the inner spacers 702 are aligned to sidewalls of the gate spacers 402 and the semiconductor layers 108, as shown in FIG. 1H. In order to form the inner spacers 702, a deposition process forms a spacer layer into the source/drain trenches 502 and the gaps 602, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 502. The deposition process is configured to ensure that the spacer layer fills the gaps 602 between the semiconductor layers 108 as well as between the semiconductor layer 108 and the substrate 102 under the gate spacers 402. An etching process is then performed that selectively etches the spacer layer to form inner spacers 702 (as shown in FIG. 1H) with minimal (to no) etching of the semiconductor layer 108, the substrate 102, the dummy gate structures 302, and the gate spacers 402. The spacer layer (and thus inner spacers 702) includes a material that is different than a material of the semiconductor layers 108 and a material of the gate spacers 402 to achieve desired etching selectivity during the etching process. In some embodiments, the inner spacers 702 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon carbon nitride (SiCN), silicon oxycarbon nitride (SiOCN)). In some embodiments, the inner spacers 702 include a low-k dielectric material, such as those described herein.

Referring to FIG. 1I, the semiconductor layer 106B are removed via a selective etching process. Specifically, the selective etching process is performed that selectively etches the semiconductor layer 106B below the gate structures 302 and the gate spacers 402 through the source/drain trenches 502, with minimal (or no) etching of the semiconductor layers 108, such that gaps 802 are formed between the semiconductor layers 108 (more specifically, between semiconductor layers 108B), below the gate structures 302 and the gate spacers 402. The etching process is configured to laterally etch (e.g., along the X-direction) the semiconductor layer 106B below the gate structures 302 and the gate spacers 402. The selective etching process is a dry etching process, a wet etching process, other suitable etching process, or combinations thereof.

Referring to FIG. 1J, dielectric layers 902 are formed to fill the gaps 802. In some embodiments, sidewalls of the dielectric layers 902 are aligned to sidewalls of the gate spacers 402, the inner spacers 702, and the semiconductor layers 108, as shown in FIG. 1J. In order to form the dielectric layers 902, a deposition process forms a dielectric material into the source/drain trenches 502 and the gaps 802, such as CVD, PVD, ALD, HDPCVD, MOCVD, RPCVD, PECVD, LPCVD, ALCVD, APCVD, other suitable methods, or combinations thereof. The dielectric material partially (and, in some embodiments, completely) fills the source/drain trenches 502. The deposition process is configured to ensure that the dielectric material fills the gaps 802 between the semiconductor layers 108 (more specifically, between the semiconductor layers 108B) under the gate structures 302 and the gate spacers 402. An etching process is then performed that selectively etches the dielectric material to form the dielectric layers 902 (as shown in FIG. 1J) with minimal (to no) etching of the semiconductor layer 108, the substrate 102, the dummy gate structures 302, the gate spacers 402, and the inner spacers 702. In some embodiments, the dielectric layers 902 are between and in contact with the semiconductor layers 108B. Furthermore, the dielectric layers 902 are also between the semiconductor layers 108A and the semiconductor layers 108C, as shown in FIG. 1J. The dielectric layers 902 are thicker than the semiconductor layers 108A and the 108C. In some embodiments, the dielectric material of dielectric layers 902 includes silicon, oxygen, carbon, nitrogen, other suitable material, or combinations thereof (for example, silicon oxide ($SiO_2$), silicon nitride (SiN), silicon oxynitride (SiON), silicon oxycarbide (SiOC), silicon carbon nitride (SiCN), silicon oxycarbon nitride (SiOCN)).

Referring to FIG. 1K, polymer layers 1002 and dielectric layers 1004 are formed in the source/drain trenches 502. More specifically, the polymer layers 1002 are first formed in lower parts of the source/drain trenches 502 to cover a bottom surface of the substrate 102 and the sidewalls of the semiconductor layers 108A (which are used for the PFET of the CFET, such as the PFET 5000P of the CFET 5000 shown in FIGS. 1Q and 5) and the inner spacers 702 (which are between the semiconductor layers 108A). In some embodiments, top surfaces of the polymer layers 1002 are lower than the dielectric layers 902 and the semiconductor layers 108B. After the formation of the polymer layers 1002, the dielectric layers 1004 are formed over the polymer layers 1002 and on the sidewalls of the semiconductor layers 108B, the semiconductor layers 108C (which are used for the NFET of the CFET, such as the NFET 5000N of the CFET 5000 shown in FIGS. 1Q and 5), the gate spacers 402, and the inner spacers 702 (which are between the semiconductor layers 108C). The polymer layers 1002 are formed of fluorine-containing polymer and its molecular structure includes silicon (Si), carbon (C), nitrogen (N), or fluorine (F). In one example, the polymer layers 1002 include fluorinated silicone or fluorinated polysilane. The polymer layers 1002 may be deposited using CVD, flowable CVD (FCVD), or spin-on coating. The dielectric layers 1004 may include aluminum oxide ($Al_2O_3$).

Referring to FIG. 1L, the polymer layers 1002 are removed via a selective etching process and source/drain features 1102P (including source/drain features 1102P-1 and 1102P-2) are formed in the source/drain trenches 502. Specifically, the selective etching process is performed that selectively etches the polymer layers 1002 below the dielectric layers 1004 through the source/drain trenches 502, with minimal (or no) etching of the semiconductor layers 108A, the substrate 202, and the inner spacers 702. The selective etching process is a dry etching process, a wet etching process, other suitable etching process, or combinations thereof. After the removal of the polymer layers 1002, the source/drain features 1102P are formed in the lower parts of the source/drain trenches 502 and below the dielectric layers 1004. The source/drain features 1102P are also formed on opposite sides of the dummy gate structure 302 in the X-direction. For example, the source/drain features 1102P-1 and 1102P-2 are formed on opposite sides of the dummy gate structure 302-2, as shown in FIG. 1L. The source/drain features 1102P are connected to and in contact with the semiconductor layers 108A. In some aspects, the semiconductor layers 108A connect the source/drain feature 1102P-1 to the source/drain feature 1102P-2. In some embodiments, the source/drain features 1102P may have top surfaces that extend higher than top surfaces of the topmost semiconductor layers 108A (e.g., in the Z-direction). In other embodiments, the top surfaces of the source/drain features 1102P and the top surfaces of the topmost semiconductor layers 108A are substantially coplanar. Furthermore, top surfaces of the source/drain features 1102P are lower than the bottom surfaces of the dielectric layers 1004, the dielectric layers 902, and the semiconductor layers 108B.

One or more epitaxy processes may be employed to grow the source/drain features 1102P. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1102P are grown from the substrate 102 and the semiconductor layers 108A rather than the semiconductor layers 108B and 108C due to the dielectric layers 1004 cover the sidewalls of the semiconductor layers 108B and 108C. The source/drain features 1102P may include any suitable semiconductor materials. For example, the source/drain features 1102P used for the PFET of the CFET (e.g., PFET 5000P of the CFET 5000 shown in FIGS. 1Q and 5) may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 1102P may be doped with boron having a doping concentration in a range from about $1\times10^{19}/cm^3$ to $6\times10^{20}/cm^3$. The source/drain features 1102P may also be referred to as source/drain, or source/drain regions. In some embodiments, source/drain feature(s) 1102P may refer to a source or a drain, individually or collectively dependent upon the context. In some embodiments, the source/drain features 1102P may be referred to as p-type source/drain features. The source/drain features 1102P may be doped in-situ or ex-situ. One or more annealing processes may be performed to activate the dopants in the source/drain features 1102P. The annealing processes may include rapid thermal annealing (RTA) and/or laser annealing processes.

Referring to FIG. 1M, the dielectric layers 1004 are removed via a selective etching process, and then dielectric layers 1202 and polymer layers 1204 are formed in the source/drain trenches 502. Specifically, the selective etching process is performed that selectively etches the dielectric layers 1004 over the source/drain features 1102P through the source/drain trenches 502, with minimal (or no) etching of the dielectric layers 902, the semiconductor layers 108B, the semiconductor layers 108C, the gate spacers 402, and the inner spacers 702. The selective etching process is a dry etching process, a wet etching process, other suitable etching process, or combinations thereof.

After the removal of the dielectric layers 1004, the dielectric layers 1202 are first conformally formed on the top surfaces of the source/drain features 1102P and on the sidewalls of the semiconductor layers 108B and the dielectric layers 902. After the formation of the dielectric layers 1202, the polymer layers 1204 are then formed over the dielectric layers 1202 and between the dielectric layers 1202. In some embodiments, top surfaces of the dielectric layers 1202 and the polymer layers 1204 are lower than the semiconductor layers 108C. The dielectric layers 1202 may include aluminum oxide ($Al_2O_3$). The polymer layers 1204 are formed of fluorine-containing polymer and its molecular structure includes silicon (Si), carbon (C), nitrogen (N), or fluorine (F). In one example, the polymer layers 1204 include fluorinated silicone or fluorinated polysilane. The polymer layers 1204 may be deposited using CVD, flowable CVD (FCVD), or spin-on coating.

Referring to FIG. 1N, source/drain features 1302N (including source/drain features 1302N-1 and 1302N-2) are formed in the source/drain trenches 502. Specifically, the source/drain features 1302N over the dielectric layers 1202, the polymer layers 1204, and the source/drain features 1102P. The source/drain features 1302N are also formed on opposite sides of the dummy gate structures 302 in the X-direction. For example, the source/drain features 1302N-1 and 1302N-2 are formed on opposite sides of the dummy gate structure 302-2, as shown in FIG. 1N. Furthermore, the source/drain features 1302N-1 and 1302N-2 are directly over the source/drain features 1302P-1 and 1302P-2, respectively. The source/drain features 1302N are connected to and in contact with the semiconductor layers 108C. In some aspects, the semiconductor layers 108C connect the source/drain feature 1302N-1 to the source/drain feature 1302N-2. In some embodiments, the source/drain features 1302N may have top surfaces that extend higher than top surfaces of the topmost semiconductor layers 108C (e.g., in the Z-direction). In other embodiments, the top surfaces of the source/drain features 1302N and the top surfaces of the topmost semiconductor layers 108C are substantially coplanar. Furthermore, the bottom surfaces of the source/drain features 1302N are higher than the top surfaces of the dielectric layers 902 and the semiconductor layers 108B. In some embodiments, bottom surfaces of the source/drain features 1302N are lower than the bottom surfaces of the bottommost semiconductor layers 108C. In other embodiments, the bottom surfaces of the source/drain features 1302N and the bottom surfaces of the bottommost semiconductor layers 108C are substantially coplanar.

One or more epitaxy processes may be employed to grow the source/drain features 1302N. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1302N are grown from the semiconductor layers 108C rather than the semiconductor layers 108B due to the dielectric layers 1202 cover the sidewalls of the semiconductor layers 108B. The source/drain features 1302N may include any suitable semiconductor materials. For example, the source/drain features 1302N used for the NFET of the CFET (e.g., NFET 5000N of the CFET 5000 shown in FIGS. 1Q and 5) may include epitaxially-grown material selected from a group consisting of SiP, SiC, SiPC, SiAs, Si, or a combination thereof. In some embodiments, the epitaxially-grown material of the source/drain features 1302N may be doped with phosphorus (or arsenic, or both) having a doping concentration in a range from about $2\times10^{19}/cm^3$ to $3\times10^{21}/cm^3$. The source/drain features 1302N may also be referred to as source/drain, or source/drain regions. In some embodiments, source/drain feature(s) 1302N may refer to a source or a drain, individually or collectively dependent upon the context. In some embodiments, the source/drain features 1302N may be referred to as n-type source/drain features. The source/drain features 1302N may be doped in-situ or ex-situ. One or more annealing processes may be performed to activate the dopants in the source/drain features 1302N. The annealing processes may include rapid thermal annealing (RTA) and/or laser annealing processes.

Referring to FIG. 1O, the dielectric layers 1202 and the polymer layers 1204 are removed via a selective etching process, and then contact etch stop layers (CESLs) 1302 and a interlayer dielectric (ILD) layer 1304 are formed in the source/drain trenches 502. Specifically, the selective etching process is performed that selectively etches the dielectric layers 1202 and the polymer layers 1204 in the source/drain trenches 502, with minimal (or no) etching of the dielectric layers 902, the semiconductor layers 108B, and the source/drain features 1102P and 1302N. The selective etching process is a dry etching process, a wet etching process, other suitable etching process, or combinations thereof.

Figures 1, 1T, 2:
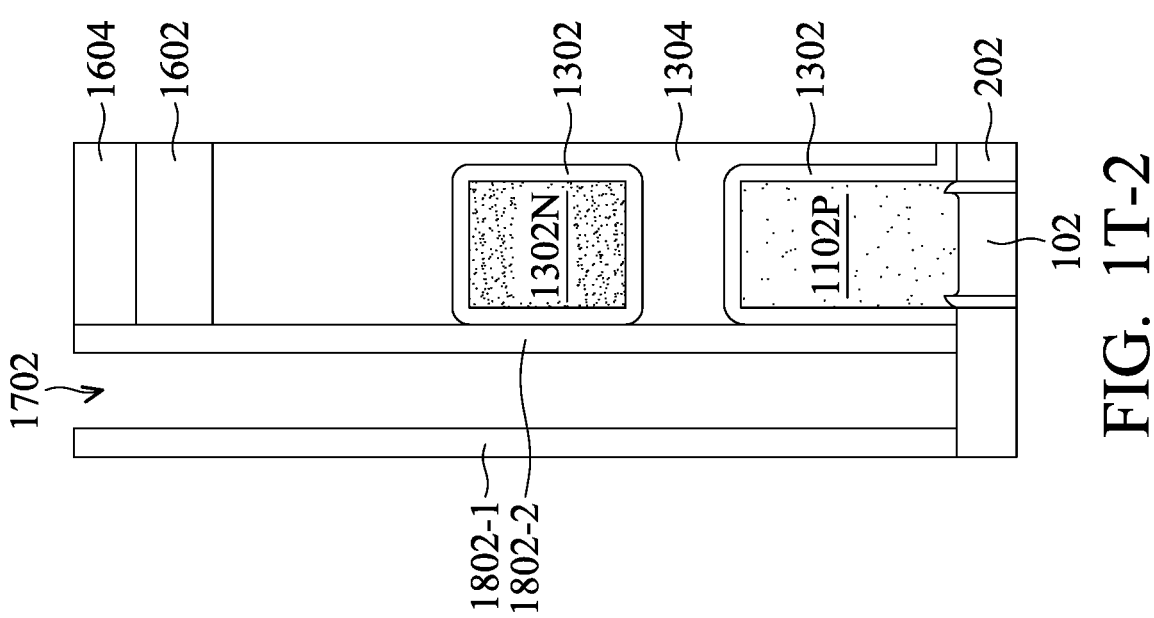
Figures 1, 1T:
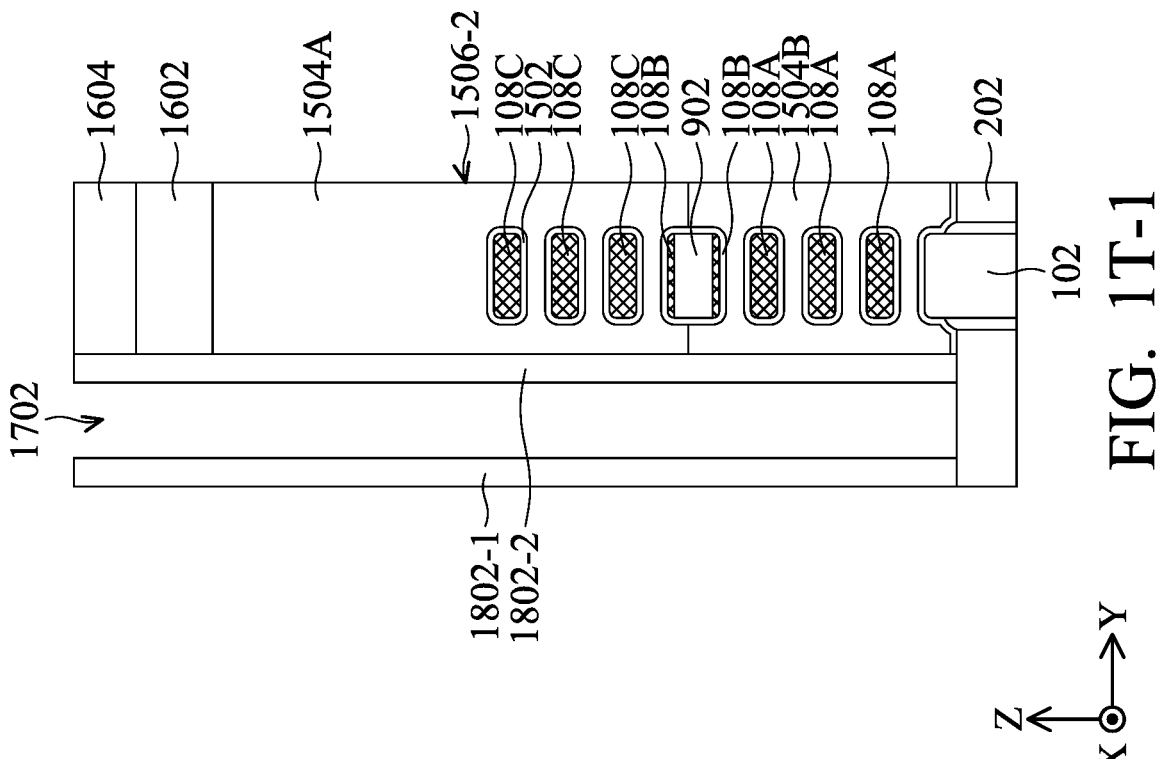

After the removal of the dielectric layers 1202 and the polymer layers 1204, a contact etch stop layers (CESLs) 1302 over the source/drain features 1102P and 1302N and an interlayer dielectric (ILD) layer 1304 over the CESLs 1302 are formed to fill the space between the gate spacers 402 and in the source/drain trenches 502. Specifically, the CESLs 1302 are conformally formed on the sidewalls of the gate spacers 402, the inner spacers 702, the dielectric layers 902, and the semiconductor layers 108B. In some embodiments, the CESLs 1302 are also conformally formed on the top surfaces of the source/drain features 1102P and 1302N and the bottom surface of the source/drain features 1302N, as shown in FIG. 1O. Furthermore, the CESLs 1302 are conformally formed on sidewalls of the source/drain features 1102P and 1302N in a Y-Z cross-section, as shown in FIG. 1R-2. In other words, the CESLs 1302 wrap around the source/drain features 1102P and 1302N.

The ILD layer 1304 is formed over and between the CESLs 1302 to fill the space between the CESLs 1302, between the gate spacers 402 and in the source/drain trenches 502. The CESLs 1302 include a material that is different than ILD layer 1304. The CESLs 1302 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 1304 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 1304 may be formed by PECVD (plasma enhanced CVD), FCVD (flowable CVD), or other suitable methods.

Referring to FIG. 1P, the dummy gate structures 302 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 302. Then, the dummy gate structures 302 are selectively etched through the masking element. The gate spacers 402 may be used as the masking element or a part thereof. Etch selectivity may be achieved by selecting the appropriate etching chemicals, and the dummy gate structures 302 may be removed without substantially affecting the CESLs 1302 and the ILD layer 1304. The removal of the dummy gate structures 302 creates gate trenches 1402-1, 1402-2, and 1402-3 (may be collectively referred to as gate trenches 1402). The gate trenches 1402 expose the top surfaces of the topmost semiconductor layers 108 that underlies the dummy gate structures 302.

Still referring to FIG. 1P, the semiconductor layers 106A of the fins 112 are selectively removed through the gate trenches 1402, using a wet or dry etching process for example, so that the semiconductor layers 108 and are exposed in the gate trench 1402 to form nanostructures stacked over each other. As such, the semiconductor layers 108 may be referred to as nanostructures. Specifically, the semiconductor layers 108C are stacked over each other in the Z-direction, and the semiconductor layers 108A are directly over the semiconductor layers 108C and are stacked over each other in the Z-direction. Such a process may also be referred to as a wire release process, a nanowire release process, a nanosheet release process, a nanowire formation process, a nanosheet formation process, or a wire formation process. In some embodiments, the removal of the semiconductor layers 106 causes the exposed semiconductor layers 108A or 108C to be spaced apart from each other in the vertical direction (e.g., in the Z-direction). The exposed semiconductor layers 108 extend longitudinally in the horizontal direction (e.g., in the X-direction). Furthermore, each of the semiconductor layers 108A connects one source/drain feature 1102P to another source/drain feature 1102P, and each of the semiconductor layers 108C connects one source/drain feature 1302N to another source/drain feature 1302N.

Referring to FIG. 1Q, gate structures 1506 (including gate structures 1506-1 to 1506-3) are formed in the gate trenches 1402 to wrap around the semiconductor layers 108. As such, the gate structures 1506 replace the dummy gate structures 302. After the formation of the gate structures 1506, a NFET 5000N and a PFET 5000P are formed. As shown in FIG. 1Q, the source/drain features 1302N-1 and 1302N-2 are formed on opposite sides of the gate structure 1506-2 in the X-direction, and the source/drain features 1102P-1 and 1102P-2 are formed on opposite sides of the gate structure 1506-2 in the X-direction. The gate structures 1506 each includes gate dielectric layers 1502 and gate electrodes 1504 (including gate electrodes 1504A and 1504B) over the gate dielectric layer 1502. In some embodiments, the gate dielectric layers 1502 are formed to wrap around the semiconductor layers 108. Additionally, the gate dielectric layers 1502 also formed on the sidewalls of the inner spacers 702 and the gate spacers 402, as well as over the top surfaces of the isolation structures 202 (shown in FIG. 1R-1). The gate dielectric layers 1502 may include a dielectric material having a dielectric constant greater than a dielectric constant of $SiO_2$, which is approximately 3.9. For example, the gate dielectric layers 1502 may include hafnium oxide ($HfO_2$), which has a dielectric constant in a range from about 18 to about 40. Alternatively, the gate dielectric layers 1502 may include other high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfSiO, (Ba,Sr)$TiO_3$ (BST), $Al_2O_3$, $Si_3N_4$, oxynitrides (SiON), combinations thereof, or other suitable material. The gate dielectric layers 1502 may be formed by ALD, PVD, CVD, oxidation, and/or other suitable methods.

In some embodiments, the gate structures 1506 may further include interfacial layers to wrap around the exposed semiconductor layers 108 before the formation of the gate dielectric layer 1502, so that the gate dielectric layers 1502 are separated from semiconductor layers 108 by the interfacial layer. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

The gate electrodes 1504 are formed to fill the remaining spaces of the gate trenches 1402, and over the gate dielectric layers 1502 in such a way that the gate electrodes 1504 wrap around the semiconductor layers 108, the gate dielectric layer 1502, and the interfacial layers (if present). The gate electrodes 1504 each may include a single layer or alternatively a multi-layer structure. In some embodiments, the gate electrodes 1504 each may include a capping layer, a barrier layer, work function metal layers, and a fill material. As shown in FIG. 1Q, the gate electrodes 1504 each include a gate electrode 1504A and a gate electrode 1504B. The gate electrodes 1504A are used for the NFET 5000N of the CFET 5000 to wrap around the semiconductor layers 108C and the gate dielectric layer 1502. The gate electrodes 1504B are used for the PFET 5000P of the CFET 5000 to wrap around the semiconductor layers 108A and the gate dielectric layer 1502. In some embodiments, the gate electrode 1504A is directly over and in contact with the gate electrode 1504B, as shown in FIG. 1R-1.

The gate electrodes 1504A include n-type work function metal layer. The n-type work function metal layer may be formed adjacent to the barrier layer. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer.

The gate electrodes 1504B include n-type work function metal layer. The p-type work function metal layer may be formed adjacent to the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, TaSi$_2$, NiSi$_2$, Mn, Zr, ZrSi$_2$, Ru, AlCu, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

Figures 1, 1U, 2:
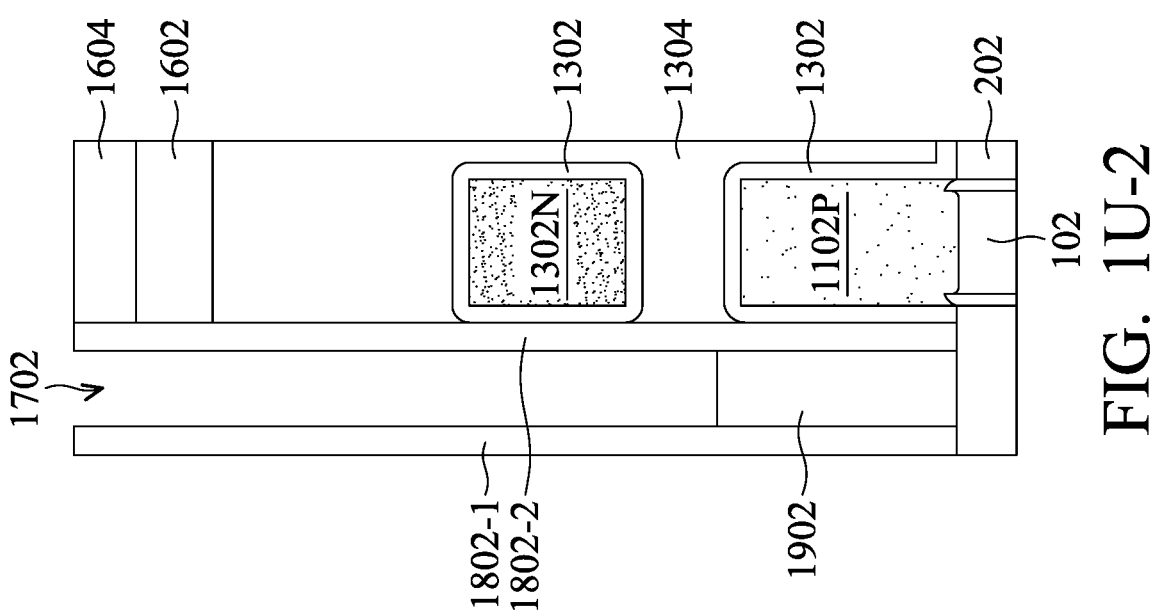
Figures 1, 1U:
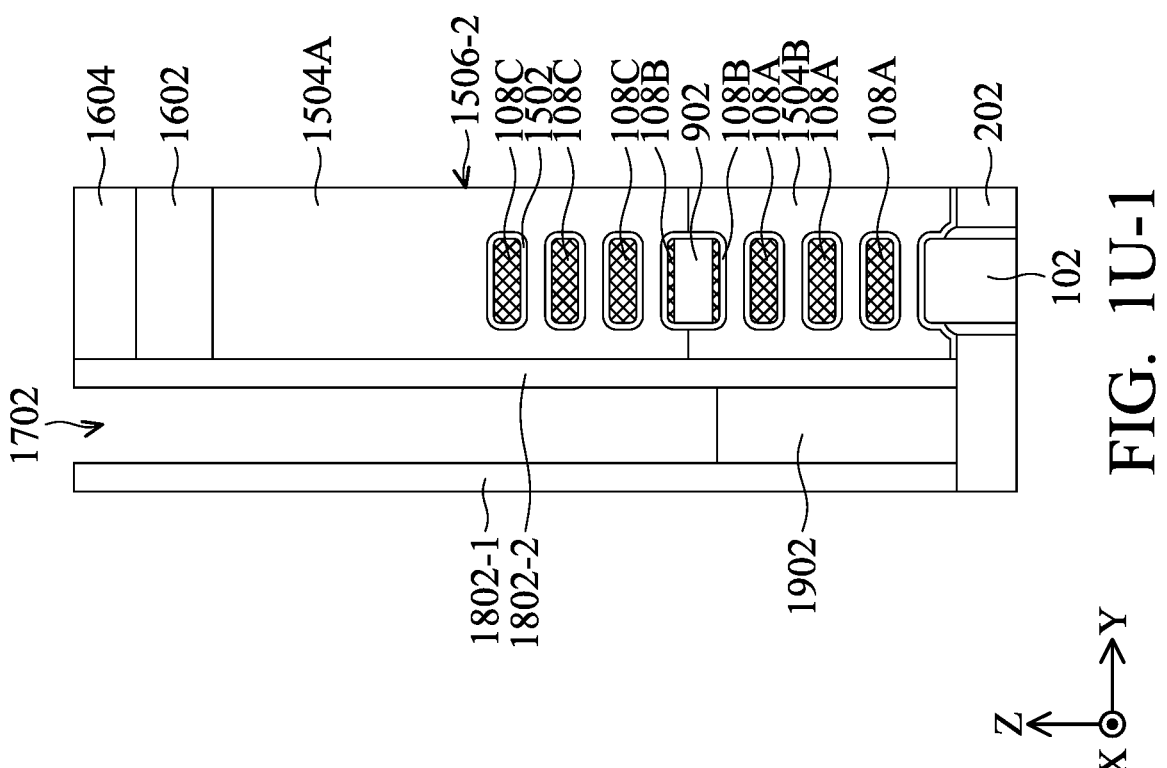
Figures 1, 1V, 2:
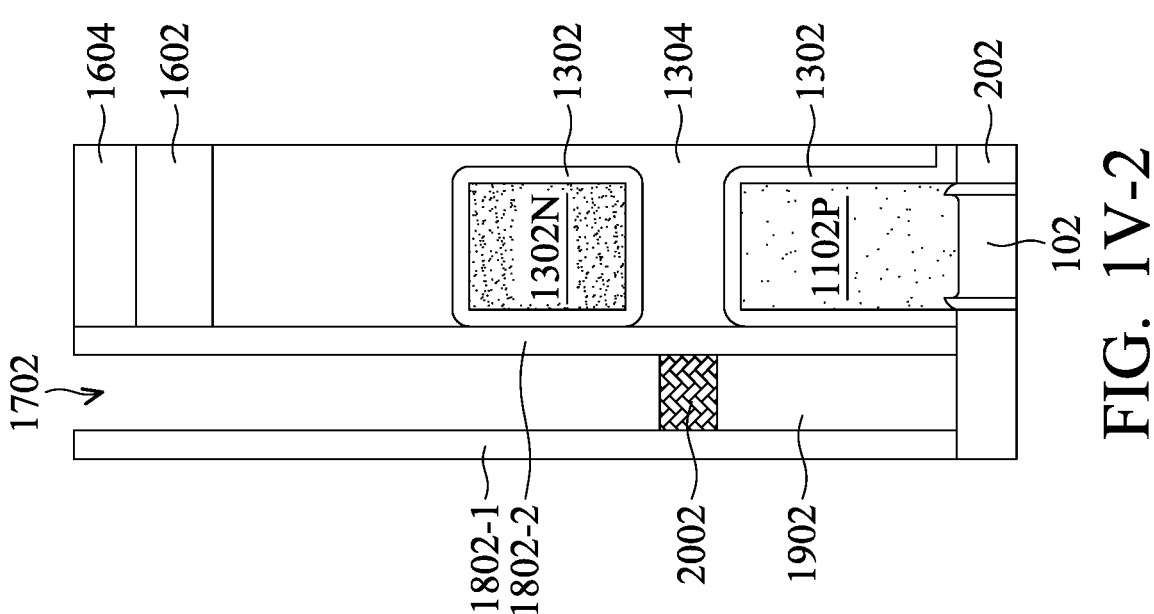
Figures 1, 1V:
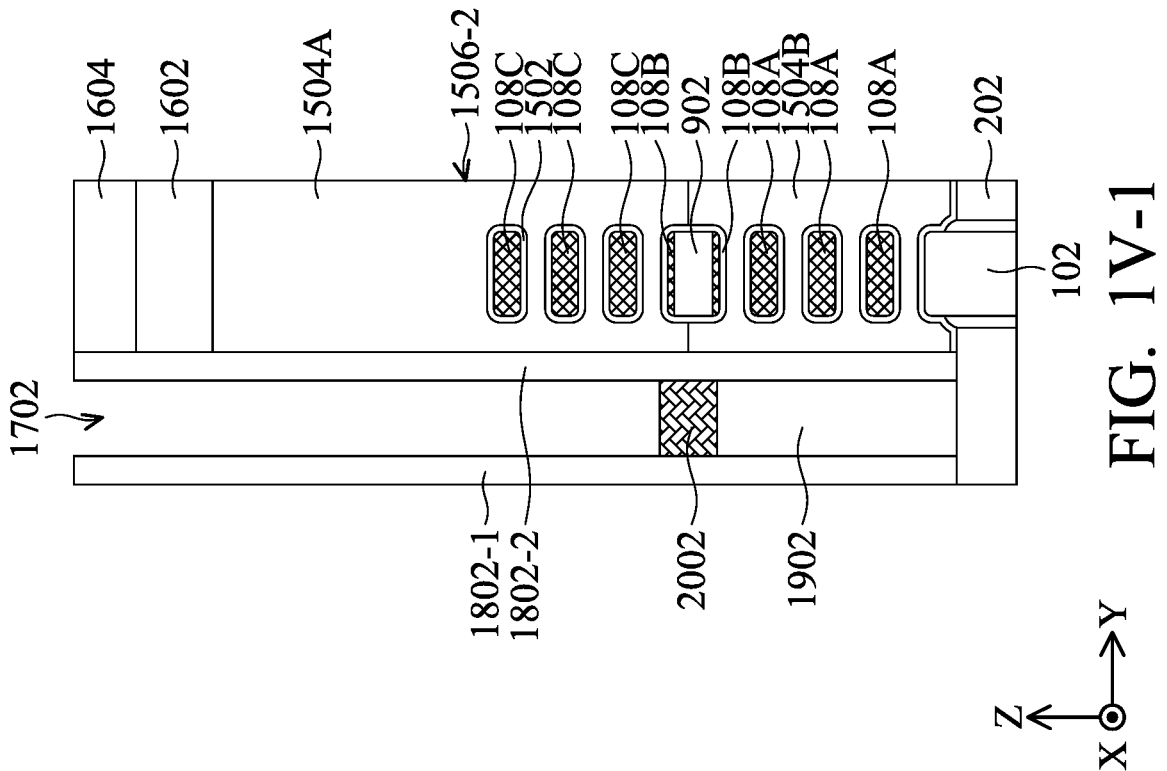
Figures 1, 1W, 2:
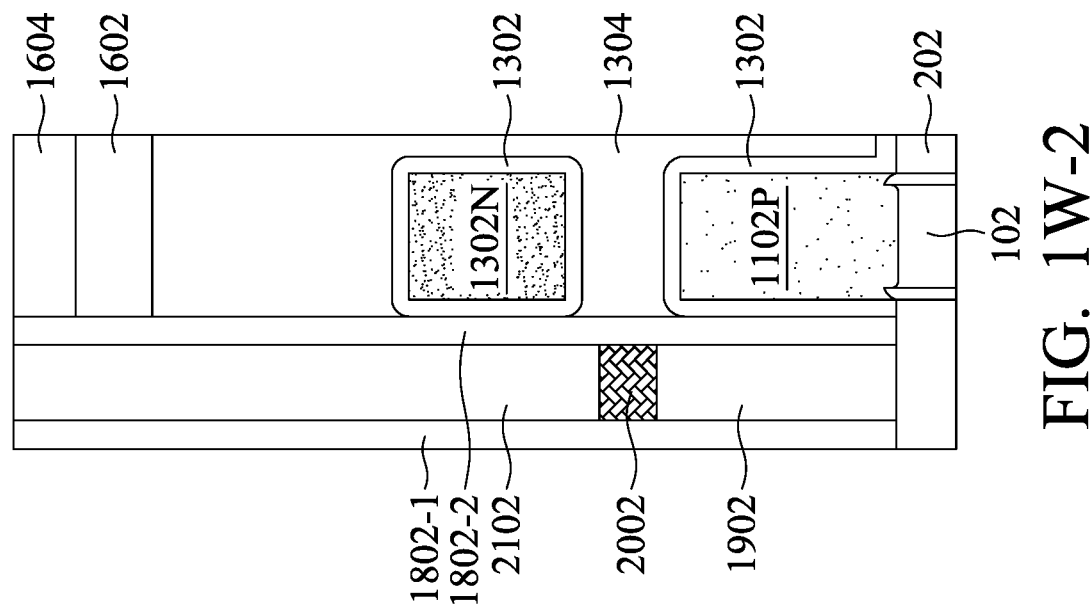
Figures 1, 1W:
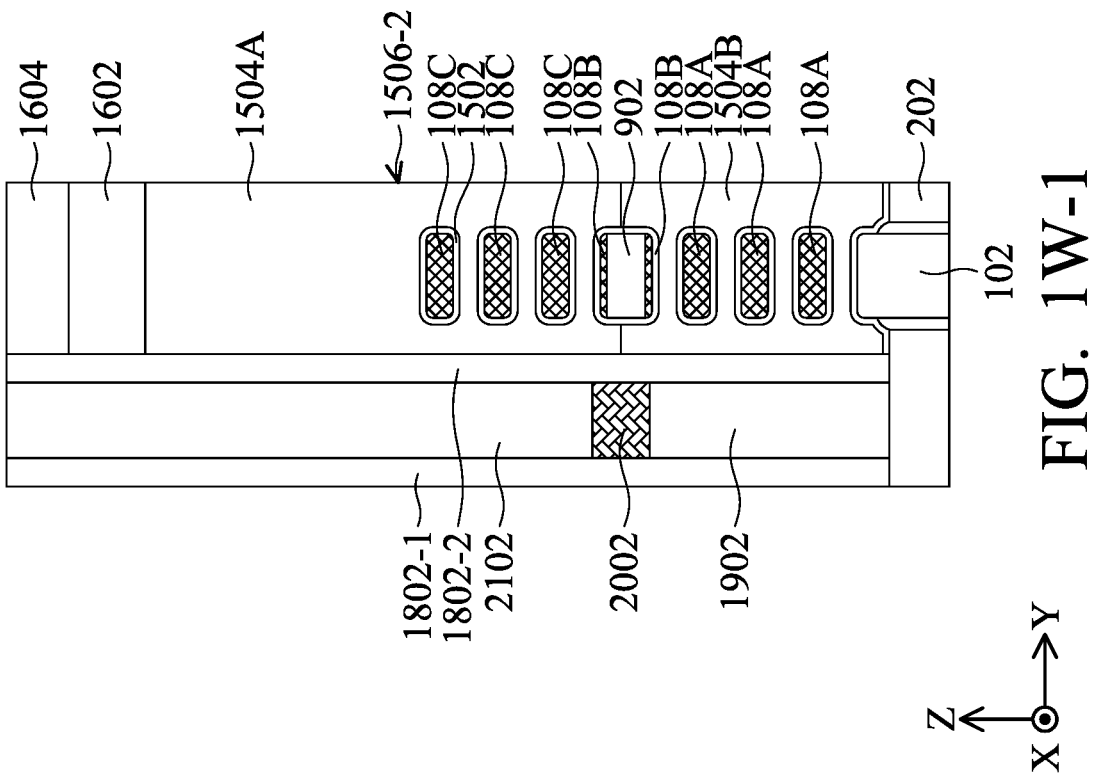
Figures 1, 1X, 2:
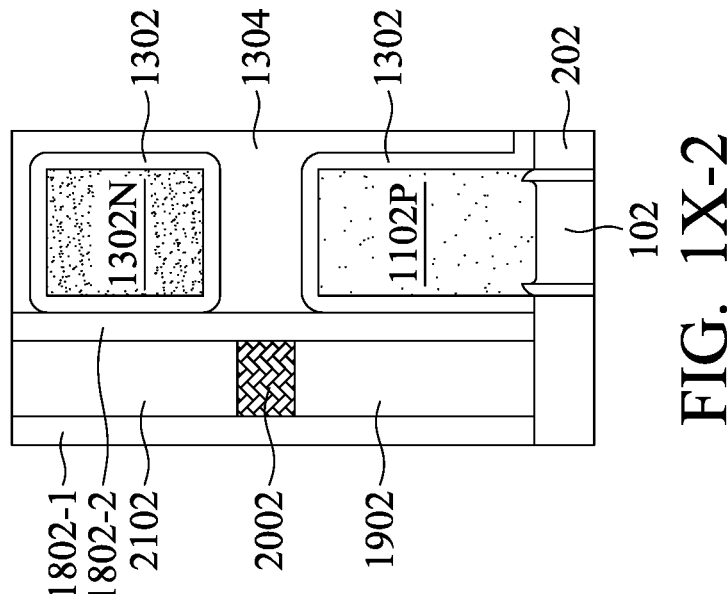
Figures 1, 1X:
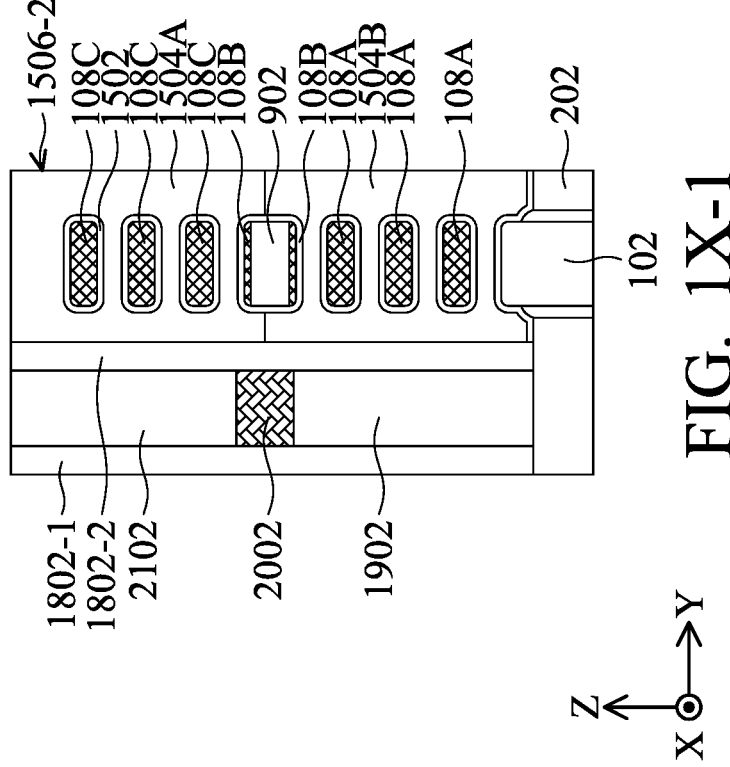

FIGS. 1R-1 to 1X-1 are Y-Z cross-sectional views of the workpiece 100 at various fabrication stages along a line A-A' of FIG. 1Q, in accordance with some embodiments of the present disclosure. FIGS. 1R-2 to 1X-2 are Y-Z cross-sectional views of the workpiece 100 at various fabrication stages along a line B-B' or a line C-C' of FIG. 1Q, in accordance with some embodiments of the present disclosure. Referring to FIGS. 1R-1 and 1R-2, a mask layer 1602 is formed over the gate structures 1506 and the ILD layer 1304, and a mask layer 1604 is formed over the mask layer 1602. The mask layers 1602 and 1604 may include silicon nitride (Si$_3$N$_4$), silicon oxide (SiO$_2$), silicon carbide (SiC), silicon oxycarbide (SiOC), silicon oxynitride (SiON), silicon carbon nitride (SiCN), silicon oxycarbon nitride (SiOCN), or combinations thereof. After the formation of the mask layers 1602 and 1604, the mask layers 1602 and 1604 are patterned by performing lithography and etching processes to from an opening 1606 exposing portions of the gate structure 1506-2 and the ILD layer 1304. As shown in FIG. 1R-1, the opening 1606 is offset from the semiconductor layers 108 and the source/drain features 1102P/1302N in the Y-direction. In other words, the opening 1606 is not directly over the semiconductor layers 108 and the source/drain features 1102P/1302N.

Referring to FIGS. 1S-1 and 1S-2, the gate structure 1506-2 and the ILD layer 1304 not covered by the mask layers 1602 and 1604 are recessed. Specifically, the portions of the gate structure 1506-2 and the ILD layer 1304 are recessed through the opening 1606 by recessing processes (e.g., etching processes) to form an opening 1702 in the gate structure 1506-2 and the ILD layer 1304, as shown in FIGS. 1S-1 and 1S-2. Furthermore, portions of the CESLs 1302 over the isolation structures 202 are recessed. The opening 1702 exposes the top surfaces of the isolation structures 202. In some embodiments, the opening 1702 exposes sidewalls of the CESLs 1302 wrapping around the source/drain features 1102P/1302N. In some embodiments, a width of the opening 1702 in the Y-direction is in a range from about 30 nm to about 80 nm.

Referring to FIGS. 1T-1 and 1T-2, sidewall layers 1802 (including sidewall layers 1802-1 and 1802-2) are formed in the opening 1702 and on sidewalls of the gate structure 1506-2 and the ILD layer 1304. Specifically, sidewall layers 1802 on sidewalls of the opening 1702 in the Y-direction. Furthermore, the sidewall layers 1802-2 are also on the sidewalls of the CESLs 1302 wrapping around the source/drain features 1102P/1302N. In some embodiments, a width of the sidewall layers 1802 in the Y-direction is in a range from about 5 nm to about 20 nm. In some embodiments, a width of the sidewall layers 1802 in the Y-direction is in a range from about 5 nm to about 20 nm. The sidewall layers 1802 may include silicon nitride (Si$_3$N$_4$), silicon oxide (SiO$_2$), silicon carbide (SiC), silicon oxycarbide (SiOC), silicon oxynitride (SiON), silicon carbon nitride (SiCN), silicon oxycarbon nitride (SiOCN), or combinations thereof. In some embodiments, the sidewall layers 1802 cut the gate structure 1506-2, such that the sidewall layers 1802 may be referred to as cut metal gate (CMG) dielectric.

Referring to FIGS. 1U-1 and 1U-2, a dielectric layer 1902 is formed in the opening 1702. Specifically, the dielectric layer 1902 is formed in the lower part of the opening 1702. In some embodiments, a top surface of the dielectric layer 1902 is higher than the top surfaces of the source/drain features 1102P, as shown in FIG. 1U-2. In other embodiments, the top surface of the dielectric layer 1902 is higher than a top surface (or a topmost surface) of the semiconductor layers 108A (or the topmost semiconductor layers 108A) in the gate structure 1506-2, as shown in FIG. 1U-1. In some aspects, the dielectric layer 1902 is adjacent to the gate structure 1506-2 and the source/drain features 1102P/1302N in the Y-direction. In some embodiments, a thickness of the dielectric layer 1902 in the Z-direction is in a range from about 10 nm to about 50 nm. In other embodiments, a width of the dielectric layer 1902 in the Y-direction is in a range from about 10 nm to about 40 nm. The dielectric layer 1902 may include silicon nitride (Si$_3$N$_4$), silicon oxide (SiO$_2$), silicon carbide (SiC), silicon oxycarbide (SiOC), silicon oxynitride (SiON), silicon carbon nitride (SiCN), silicon oxycarbon nitride (SiOCN), or combinations thereof. The dielectric layer 1902 is formed by a deposition process, such as CVD, PVD, ALD, HDPCVD, MOCVD, RPCVD, PECVD, LPCVD, other suitable methods, or combinations thereof.

Referring to FIGS. 1V-1 and 1V-2, a metal rail 2002 is formed in the opening 1702, over the dielectric layer 1902, and between the sidewall layers 1802. The metal rail 2002 extends in the X-direction (not shown in FIG. 1V-1, may refer to FIG. 5). The metal rail 2002 is spaced apart from (or adjacent to) the gate structure 1506-2 in the Y-direction, as show in FIG. 1V-1. In some embodiments, a top surface of the metal rail 2002 is lower than the bottom surfaces of the source/drain features 1302N and a bottom surface (or a bottommost surface) of the semiconductor layers 108C (or the bottommost semiconductor layers 108C) in the gate structure 1506-2. In some embodiments, a bottom surface of the metal rail 2002 is higher than the top surfaces of the source/drain features 1102P and the top surface (or the topmost surface) of the semiconductor layers 108A (or the topmost semiconductor layers 108A) in the gate structure 1506-2. As shown in FIG. 1V-1, the sidewall layer 1802-2 is between the gate structure 1506-2 and the metal rail 2002 in the Y-direction. In some aspects, the sidewall layer 1802-2 is between the source/drain features 1102P/1302N and the metal rail 2002 in the Y-direction. In some embodiments, two sidewall layers 1802-1 and 1802-2 are in contact with sidewalls of the metal rail 2002 in the Y-direction. Furthermore, a top surface of the dielectric layer 1902 is in contact with the bottom surface of the metal rail 2002, as shown in FIGS. 1V-1 and 1V-2. In some embodiments, a thickness of the metal rail 2002 in the Z-direction is in a range from about 10 nm to about 50 nm. In other embodiments, a width of the metal rail 2002 in the Y-direction is in a range from about 10 nm to about 40 nm. Furthermore, a length of the metal rail 2002 in the X-direction is in a range from about 40 nm to about 1000 nm, as shown in FIG. 5. The material of the metal rail 2002 is selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

Referring to FIGS. 1W-1 and 1W-2, a dielectric layer 2102 is formed in the opening 1702, over the metal rail 2002, and between the sidewall layers 1802. In some embodiments, a bottom surface of the dielectric layer 2102 is lower than the bottom surfaces of the source/drain features 1302N, as shown in FIG. 1W-2. In other embodiments, the bottom surface of the dielectric layer 2102 is lower than the bottom surface (or the bottommost surface) of the semiconductor layers 108C (or the bottommost semiconductor layers 108C) in the gate structure 1506-2, as shown in FIG. 1W-1. In some aspects, the dielectric layer 1902 is adjacent to the gate structure 1506-2 and the source/drain features 1102P/1302N in the Y-direction. Furthermore, the bottom surface of the dielectric layer 2102 is in contact with the top surface of the metal rail 2002, as shown in FIGS. 1W-1 and 1W-2. The dielectric layer 2102 may include silicon nitride $(Si_3N_4)$, silicon oxide $(SiO_2)$, silicon carbide (SiC), silicon oxycarbide (SiOC), silicon oxynitride (SiON), silicon carbon nitride (SiCN), silicon oxycarbon nitride (SiOCN), or combinations thereof. The dielectric layer 2102 is formed by a deposition process, such as CVD, PVD, ALD, HDPCVD, MOCVD, RPCVD, PECVD, LPCVD, other suitable methods, or combinations thereof.

Referring to FIGS. 1X-1 and 1X-2, a planarization process may be performed to remove the mask layers 1602 and 1604 and thin (decrease) the thickness of the sidewall layers 1802, the dielectric layer 2102, the gate structures 1506, and the ILD layer 1304. The planarization process may be e.g., a grinding or a CMP, and may be performed such that the top surfaces of the sidewall layers 1802, the dielectric layer 2102, the gate structures 1506, and the ILD layer 1304 are level or are substantially level. After the planarization process, a thickness of the dielectric layer 2102 in the Z-direction is in a range from about 10 nm to about 50 nm.

Figures 1, 1Y, 2, 3:
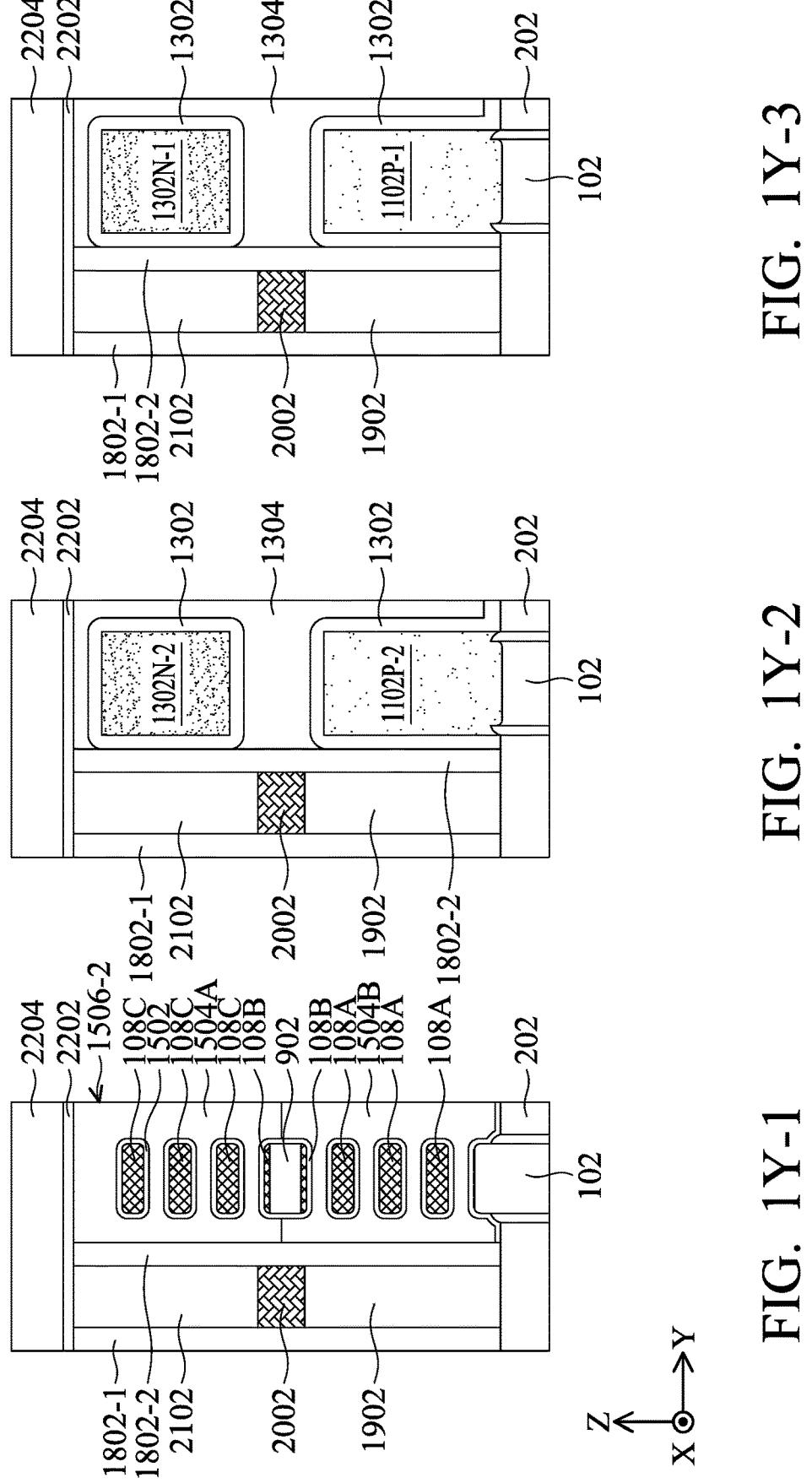
Figures 1, 1Z, 2, 3:
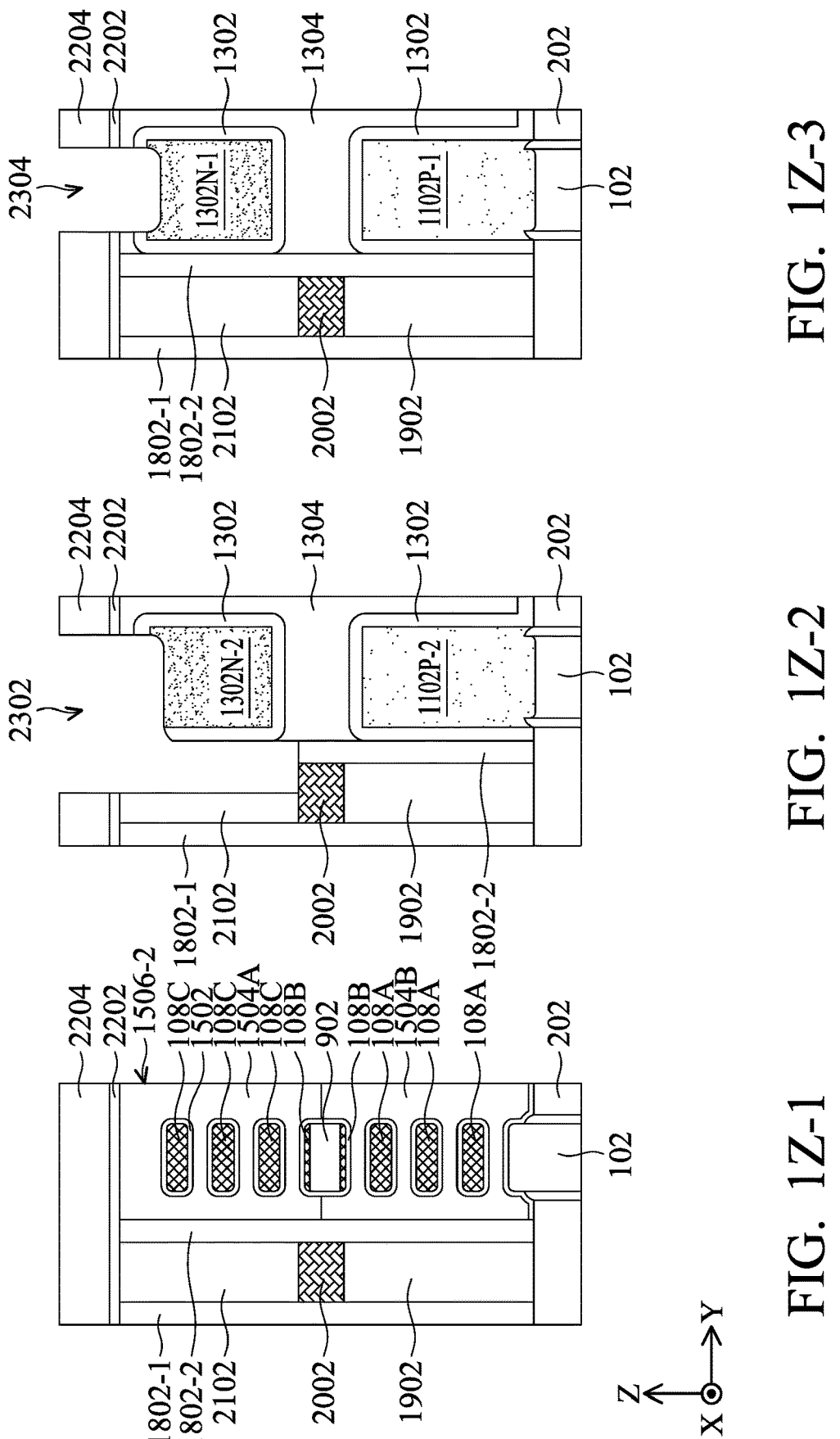
Figure 1Z:
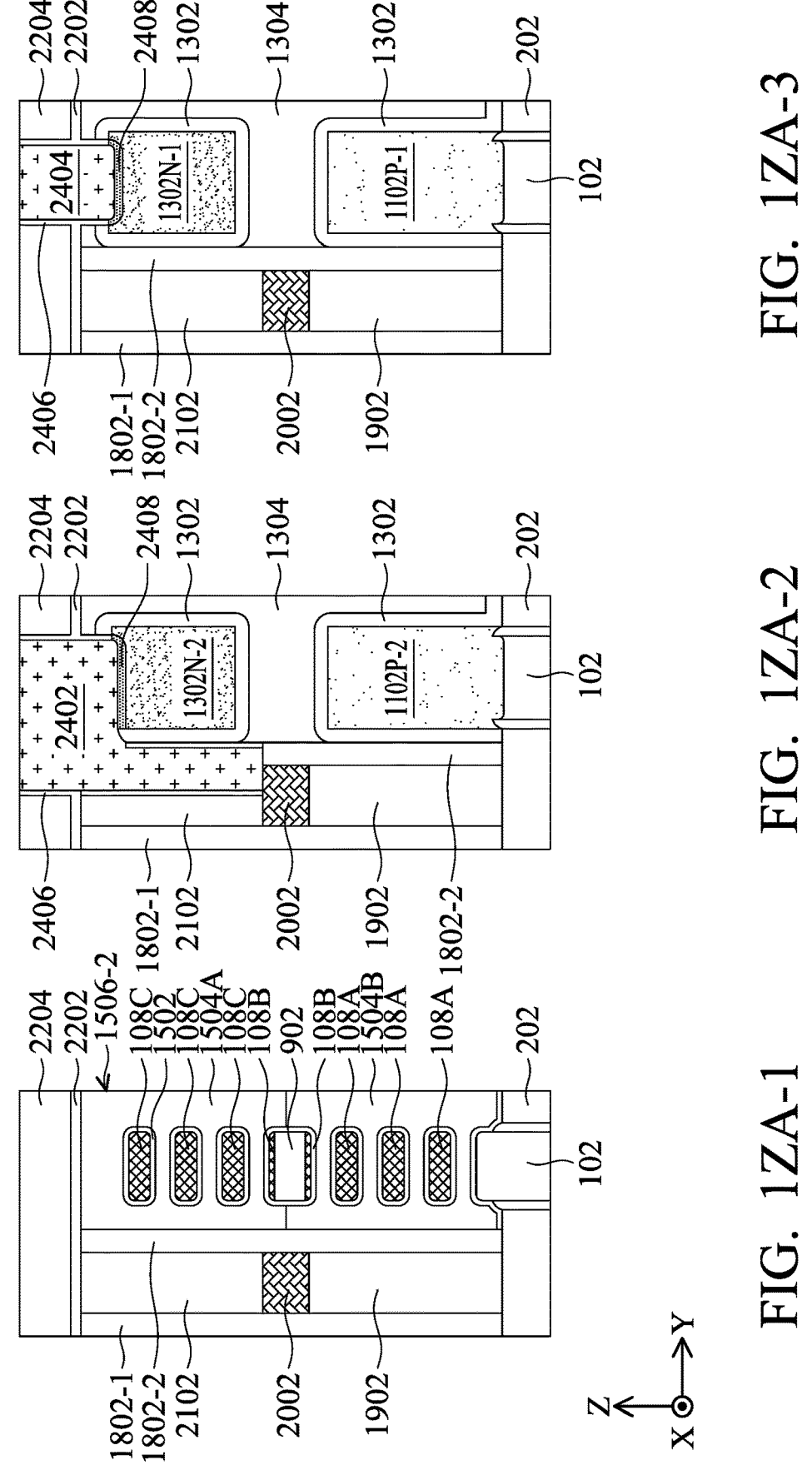
Figure 1Z:
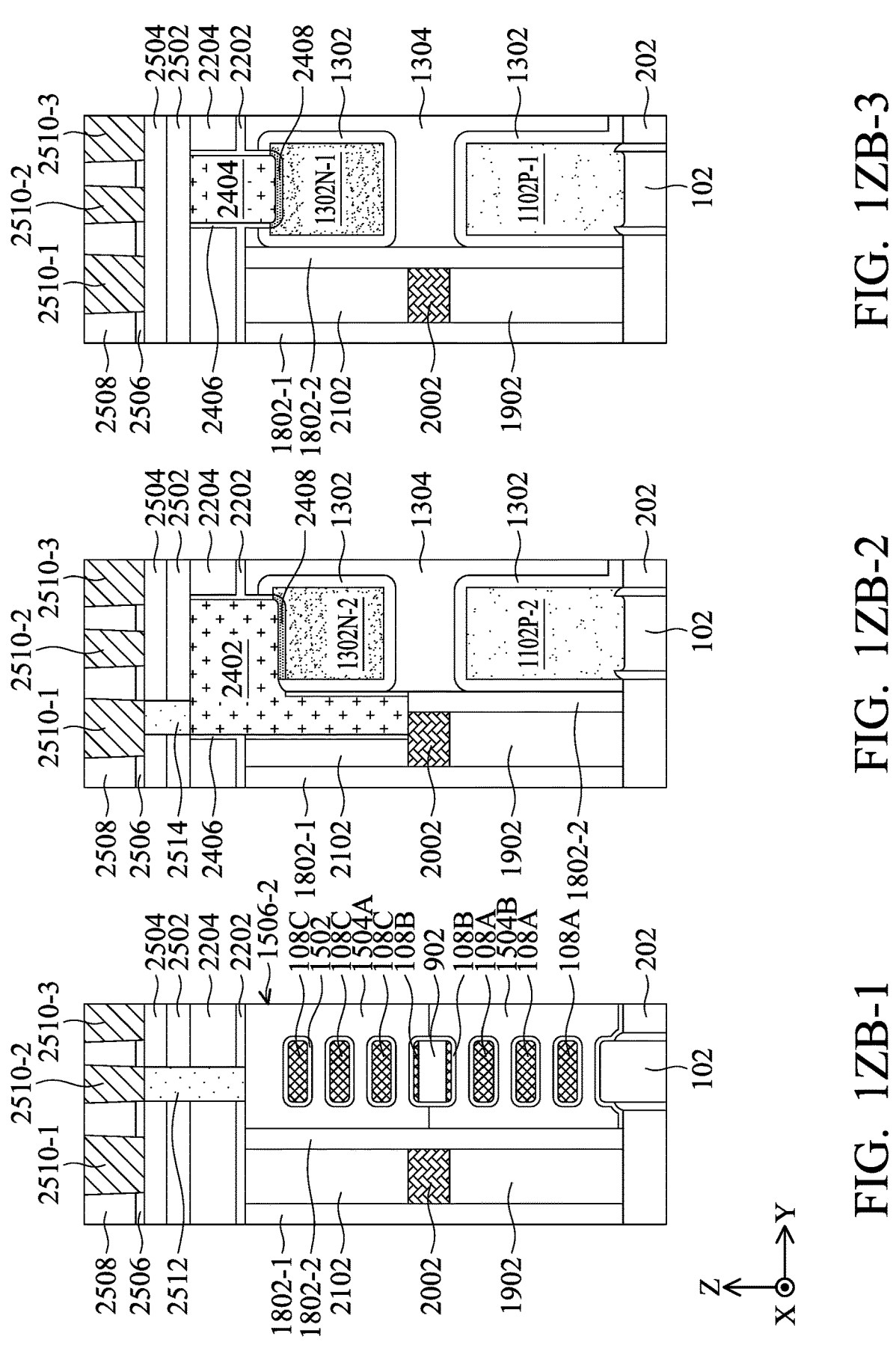
Figure 1Z:
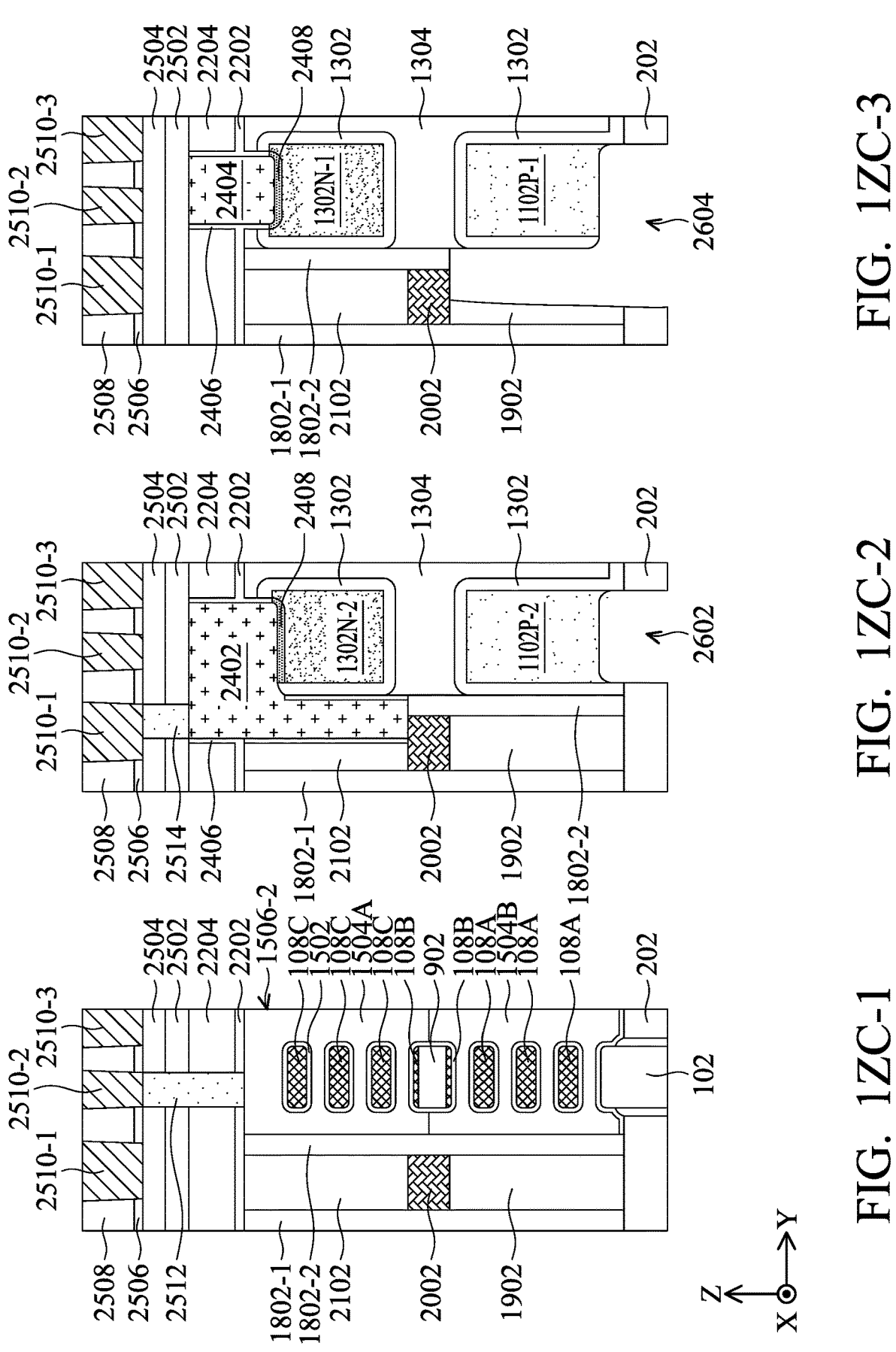
Figure 1Z:
Figure 1Z:
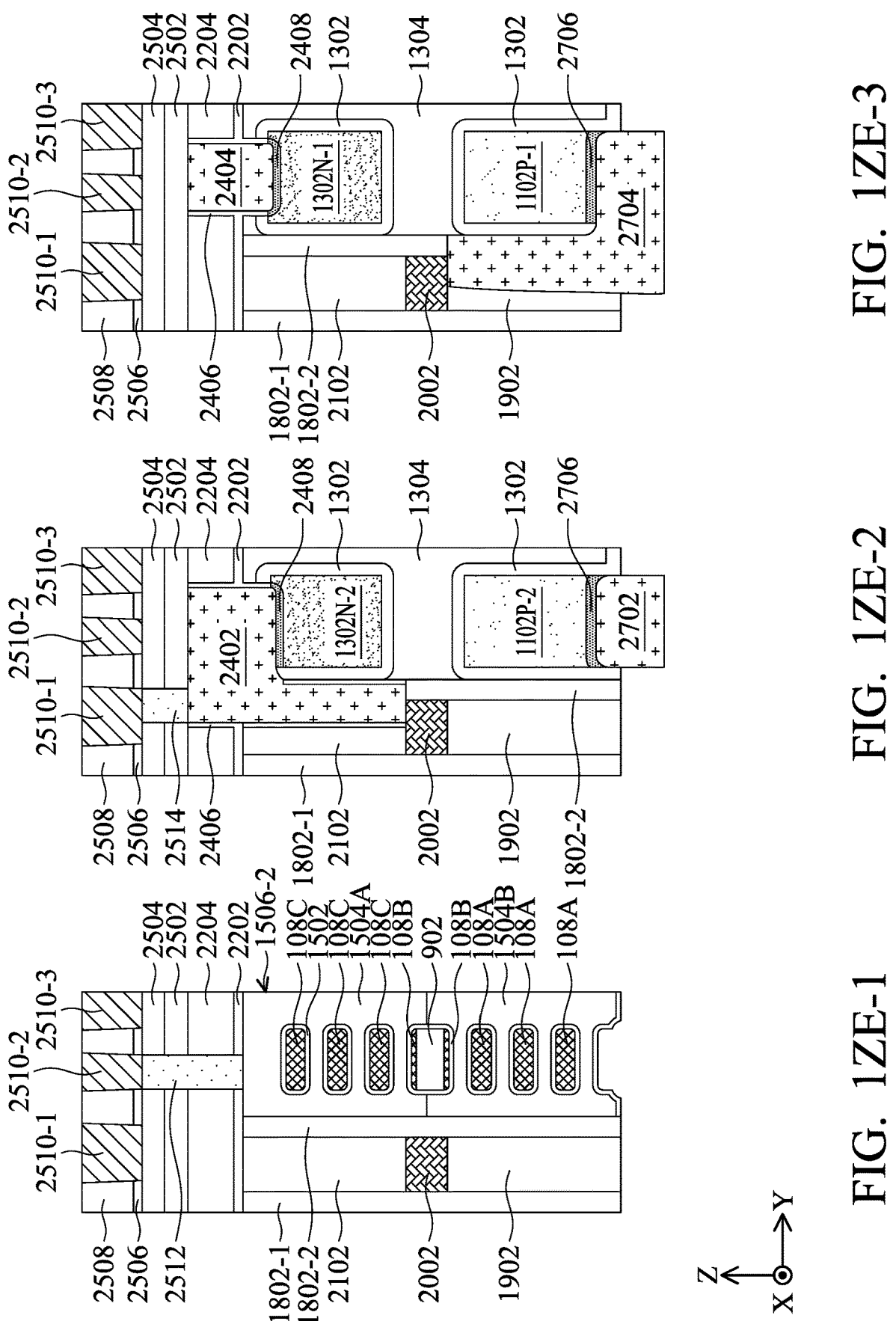
Figure 1Z:
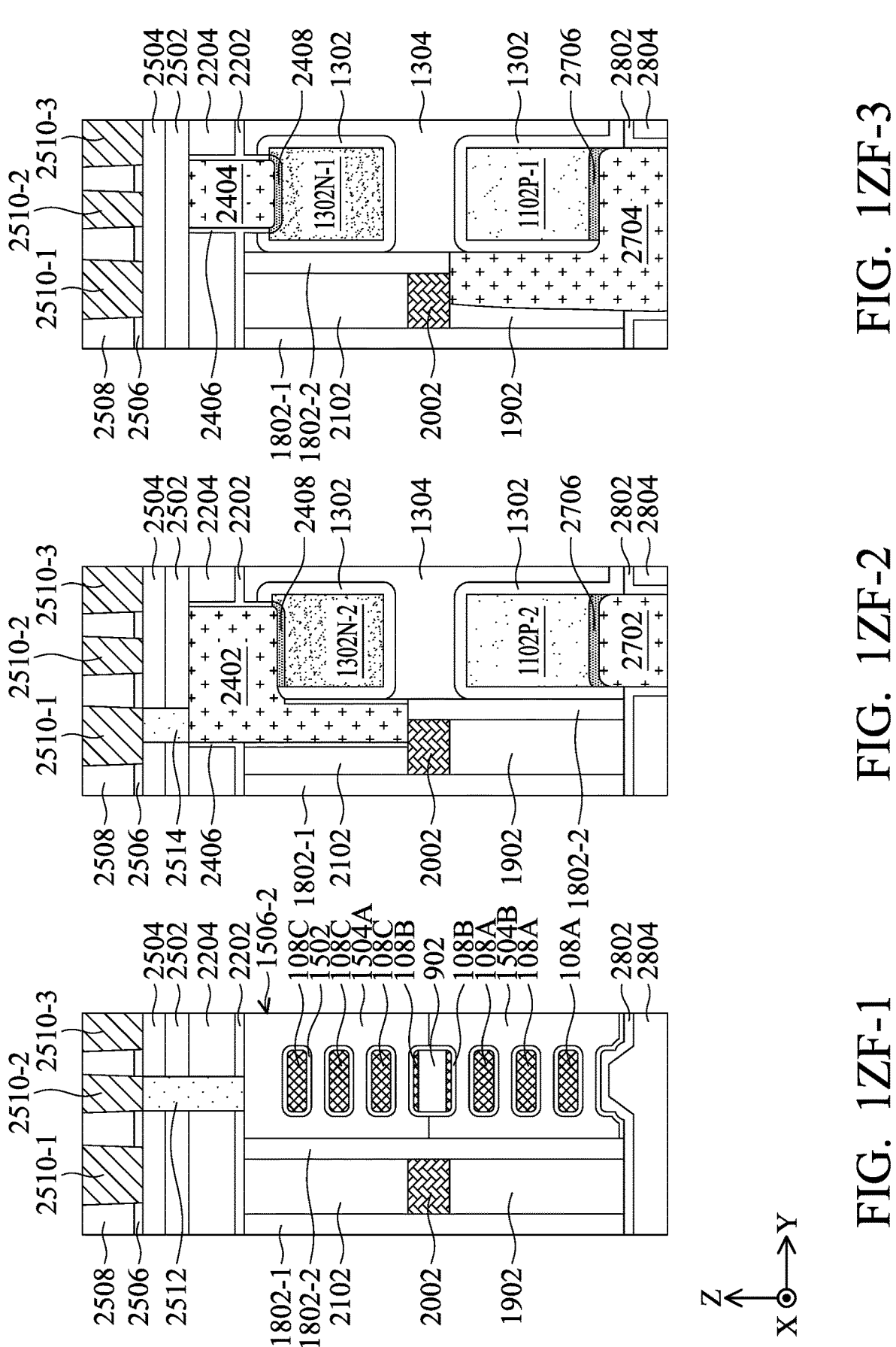
Figure 1Z:
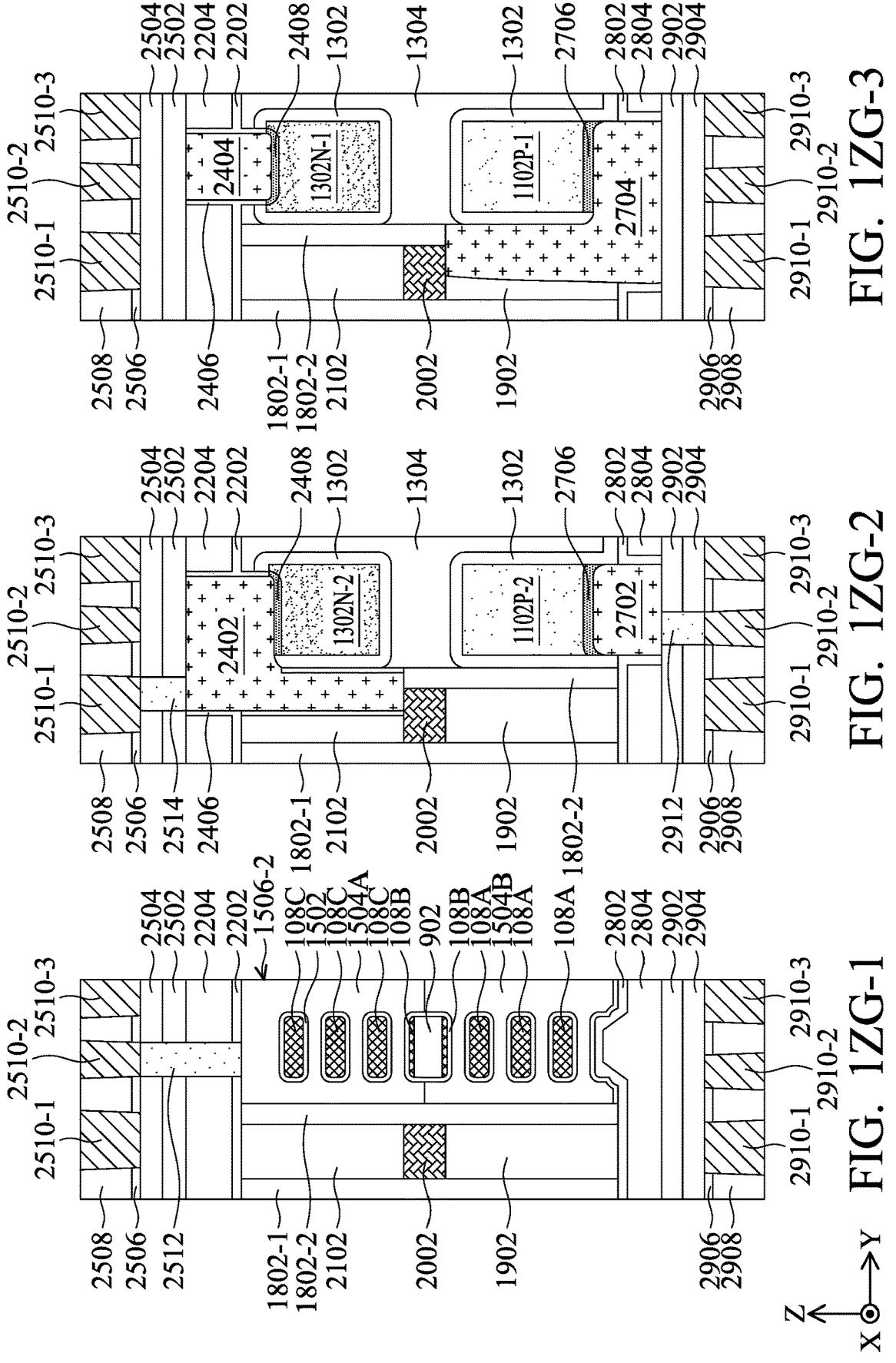

FIGS. 1Y-1 to 1ZG-1 are Y-Z cross-sectional views of the workpiece 100 at various fabrication stages along the line A-A' of FIG. 1Q, in accordance with some embodiments of the present disclosure. FIGS. 1Y-2 to 1ZG-2 are Y-Z cross-sectional views of the workpiece 100 at various fabrication stages along the line B-B' of FIG. 1Q, in accordance with some embodiments of the present disclosure. FIGS. 1Y-3 to 1ZG-3 are Y-Z cross-sectional views of the workpiece 100 at various fabrication stages along the line C-C' of FIG. 1Q, in accordance with some embodiments of the present disclosure. Referring to FIGS. 1Y-1 to 1Y-3, a dielectric layers 2202 and 2204 are formed over the sidewall layers 1802, the dielectric layer 2102, the gate structures 1506, and the ILD layer 1304. Specifically, the dielectric layer 2202 is formed over and covers the sidewall layers 1802, the dielectric layer 2102, the gate structures 1506, and the ILD layer 1304, and the dielectric layer 2204 is formed over the dielectric layer 2202. The dielectric layer 2202 may serve as a contact etch stop layer and include a dielectric material similar to the material of the CESLs 1302. In some embodiments, the dielectric layer 2202 includes silicon nitride $(Si_3N_4)$. The dielectric layer 2204 may include silicon nitride $(Si_3N_4)$, silicon oxide $(SiO_2)$, silicon carbide (SiC), silicon oxycarbide (SiOC), silicon oxynitride (SiON), silicon carbon nitride (SiCN), silicon oxycarbon nitride (SiOCN), or combinations thereof. In some embodiments, the dielectric layer 2204 includes a dielectric material similar to the material of the ILD layer 1304. The dielectric layers 2202 and 2204 may be formed by any suitable processes, such as CVD, PECVD, flowable CVD (FCVD), or combinations thereof.

Referring to FIGS. 1Z-1 to 1Z-3, portions of the dielectric layer 2202, the dielectric layer 2204, the ILD layer 1304, the CESLs 1302, the sidewall layer 1802-2, and the dielectric layer 2102 are recessed to form contact openings 2302 and 2304. In some embodiments, portions of the source/drain features 1302N may also be recessed. The contact openings 2302 and 2304 are respectively over the source/drain features 1302N-2 and 1302N-1. In some embodiments, the contact openings 2302 and 2304 may be referred to as source/drain contact openings. Any appropriate methods may be used to form the contact openings 2302 and 2304, such as multiple lithography and etching processes. The contact openings 2302 exposes the top surfaces of the source/drain feature 1302N-2 and the metal rail 2002 for subsequent source/drain contact formation. The contact openings 2304 exposes the top surface of the source/drain feature 1302N-1 for subsequent source/drain contact formation. As shown in FIGS. 1Z-2 and 1Z-3, the sidewalls of the source/drain features 1302N-1 and 1302N-2 are not exposed and covered by the CESLs 1302.

Referring to FIGS. 1ZA-1 to 1ZA-3, a conductive material is form in the contact openings 2302 and 2304 to respectively form source/drain contacts 2402 and 2404. The source/drain contact 2402 has an L-shape in the Y-Z cross-sectional view, as shown in FIG. 1ZA-2. The source/drain contact 2402 is in contact with the top surfaces of the source/drain feature 1302N-2 and the metal rail 2002, such that the source/drain contact 2402 electrically connects the source/drain feature 1302N-2 to the metal rail 2002. In some embodiments, the source/drain contact 2402 is separated from a sidewall of the source/drain feature 1302N-2. Specifically, the CESL 1302 on the sidewall of the source/drain feature 1302N-2 separate the source/drain contact 2402 from the sidewall of the source/drain feature 1302N-2, as shown in FIG. 1ZA-2. the conductive material of the source/drain contacts 2402 and 2404 may include Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 2402 and 2404 may each include single conductive material layer or multiple conductive layers.

In some embodiments, before the formation of the source/drain contacts 2402 and 2404, nitride layers 2406 including silicon nitride $(Si_3N_4)$ are formed on sidewalls of the contact openings 2302 and 2304. More specifically, the nitride layers 2406 are formed on sidewalls of the dielectric layer 2202, the dielectric layer 2204, the ILD layer 1304, the CESLs 1302. In some embodiments, before the formation of the source/drain contacts 2402 and 2404, portions of the source/drain feature 1302N-1 and 1302N-2 are transferred into silicide features 2408, as shown in FIGS. 1ZA-2 and 1ZA-3. The silicide features 2408 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 1ZB-1 to 1ZB-3, a front-side interconnection structure is formed over the workpiece 100. The front-side interconnection structure includes a nitride layer 2502, an oxide layer 2504, a CESL 2506, an ILD layer 2508, metal conductors 2510 (including metal conductors 2510-1, 2510-2, and 2510-3), and vias 2512 and 2514. The nitride layer 2502 including silicon nitride ($Si_3N_4$) is formed over the dielectric layer 2204 and source/drain contacts 2402 and 2404. The oxide layer 2504 including silicon oxide ($SiO_2$) is formed over the nitride layer 2502. The CESL 2506 is formed over the oxide layer 2504 and the ILD layer 2508 is formed over the CESL 2506. The CESL 2506 includes a material similar to the material of the CESLs 1302 discussed above. The ILD layer 2508 includes a material similar to the material of the ILD layer 1304 discussed above. The metal conductors 2510 are formed over the oxide layer 2504 and passing through the 2506 and 2508. The via 2512 is formed passing through the dielectric layer 2202, the dielectric layer 2204, the nitride layer 2502, and the oxide layer 2504 to electrically connect the gate structure 1506-2 to the metal conductor 2510-2, as shown in FIG. 1ZB-1. The via 2512 is formed passing through the nitride layer 2502 and the oxide layer 2504 to electrically connect the gate structure 1506-2 to the metal conductor 2510-1, as shown in FIG. 1ZB-2. The materials of the vias 2512 and 2514, and the metal conductors 2510 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

After the formation of the front-side interconnection structure, the workpiece 100 may be flipped to form backside source/drain contacts and a back-side interconnection structure. For the purpose of simplicity, the sequent figures are shown without being flipped. Referring to FIGS. 1ZC-1 to 1ZC-3, portions of the substrate 102, the isolation structures 202, the ILD layer 1304, the CESLs 1302, the sidewall layer 1802-2, and the dielectric layer 1902 are recessed are recessed to form contact openings 2602 and 2604. In some embodiments, portions of the source/drain features 1102P may also be recessed. The contact openings 2602 and 2604 are respectively under the source/drain features 1102P-2 and 1102P-1. In some embodiments, the contact openings 2602 and 2604 may be referred to as source/drain contact openings. Any appropriate methods may be used to form the contact openings 2602 and 2604, such as multiple lithography and etching processes. The contact openings 2602 exposes the bottom surface of the source/drain feature 1102P-2 for subsequent source/drain contact formation. The contact openings 2604 exposes the bottom surfaces of the source/drain feature 1102P-1 and the metal rail 2002 for subsequent source/drain contact formation. As shown in FIGS. 1ZC-2 and 1ZC-3, the sidewalls of the source/drain features 1102P-1 and 1102P-2 are not exposed and covered by the CESLs 1302.

Referring to FIGS. 1ZD-1 to 1ZD-3, a conductive material is form in the contact openings 2602 and 2604 to respectively form source/drain contacts 2702 and 2704. The source/drain contact 2704 has an L-shape in the Y-Z cross-sectional view, as shown in FIG. 1ZD-3. The source/drain contact 2704 is in contact with the bottom surfaces of the source/drain feature 1102P-1 and the metal rail 2002, such that the source/drain contact 2704 electrically connects the source/drain feature 1102P-1 to the metal rail 2002. In some embodiments, the source/drain contact 2704 is separated from a sidewall of the source/drain feature 1102P-1. Specifically, the CESL 1302 on the sidewall of the source/drain feature 1102P-1 separate the source/drain contact 2704 from the sidewall of the source/drain feature 1102P-1, as shown in FIG. 1ZD-3. The conductive material of the source/drain contacts 2602 and 2604 may include Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 2602 and 2604 may each include single conductive material layer or multiple conductive layers.

In some embodiments, before the formation of the source/drain contacts 2602 and 2604, portions of the source/drain feature 1102P-1 and 1102P-2 are transferred into silicide features 2706, as shown in FIGS. 1ZD-2 and 1ZD-3. The silicide features 2706 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 1ZE-1 to 1ZE-3, the substrate 102 and the isolation structures 202 are removed. More specifically, one or more selective etching processes are performed that selectively etches the substrate 102 and the isolation structures 202, with minimal (or no) etching of the gate structures 1506, the source/drain contact 2702, the source/drain contact 2704, the CESLs 1302, the sidewall layers 1802, the dielectric layer 1902. The selective etching process is a dry etching process, a wet etching process, other suitable etching process, or combinations thereof.

Referring to FIGS. 1ZF-1 to 1ZF-3, a nitride layer 2802 and an oxide layer 2804 are formed. More specifically, the nitride layer 2802 is conformally formed on bottom surfaces of the gate structures 1506, the CESLs 1302, the sidewall layers 1802, the dielectric layer 1902, and conformally formed on sidewalls of the source/drain contacts 2702 and 2704. After the formation of the nitride layer 2802, the oxide layer 2804 is then formed under the nitride layer 2802. In some embodiments, the nitride layer 2802 may include silicon nitride ($Si_3N_4$) and the oxide layer 2804 may include silicon oxide ($SiO_2$).

Referring to FIGS. 1ZG-1 to 1ZG-3, a back-side interconnection structure is formed under the workpiece 100. The back-side interconnection structure includes a nitride layer 2902, an oxide layer 2904, a CESL 2906, an ILD layer 2908, metal conductors 2910 (including metal conductors 2910-1, 2910-2, and 2910-3), and a via 2912. The nitride layer 2902 including silicon nitride ($Si_3N_4$) is formed under the oxide layer 2804 and source/drain contacts 2702 and 2704. The oxide layer 2904 including silicon oxide ($SiO_2$) is formed under the nitride layer 2902. The CESL 2906 is formed under the oxide layer 2904 and the ILD layer 2908 is formed under the CESL 2906. The CESL 2906 includes a material similar to the material of the CESLs 1302 discussed above. The ILD layer 2908 includes a material similar to the material of the ILD layer 1304 discussed above. The metal conductors 2910 are formed under the oxide layer 2904 and passing through the 2906 and 2908. The via 2912 is formed passing through the nitride layer 2902 and the oxide layer 2904 to electrically connect the source/drain feature 2702 to the metal conductor 2910-2, as shown in FIG. 1ZG-2. The materials of the via 2912 and the metal conductors 2910 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof. After the formation of the back-side interconnection structure, a CFET 5000 is formed, as shown in FIG. 5.

Figure 2B:
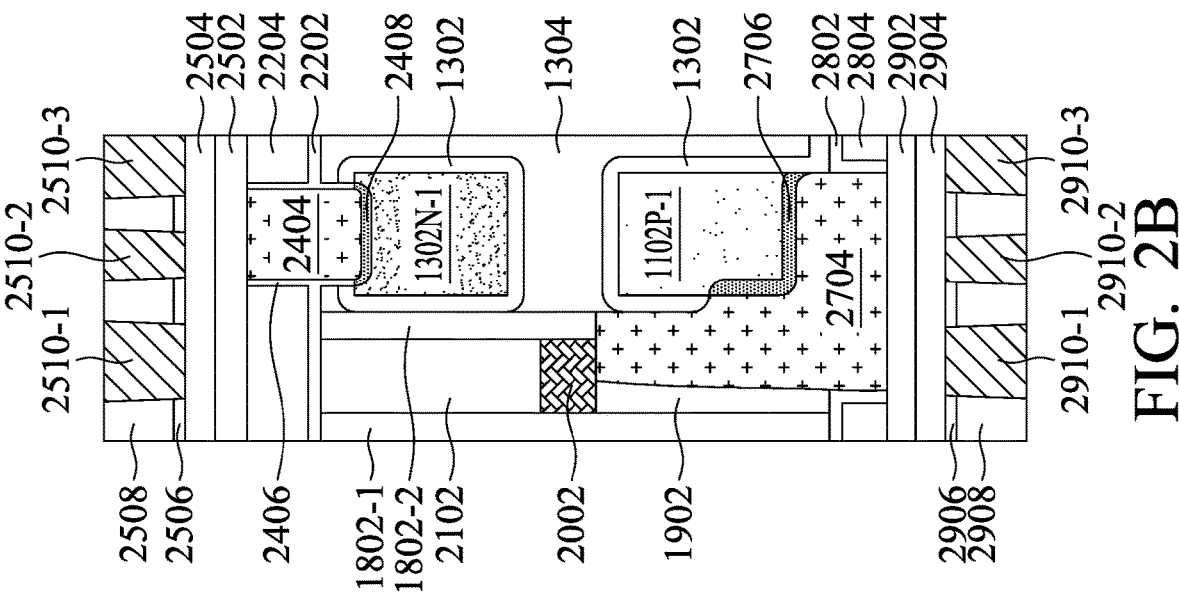
FIGS. 2A and 2B are Y-Z cross-sectional views of the workpiece along the lines B-B' and C-C' of FIG. 1Q, respectively, in accordance with some embodiments of the present disclosure.
Figure 2A:
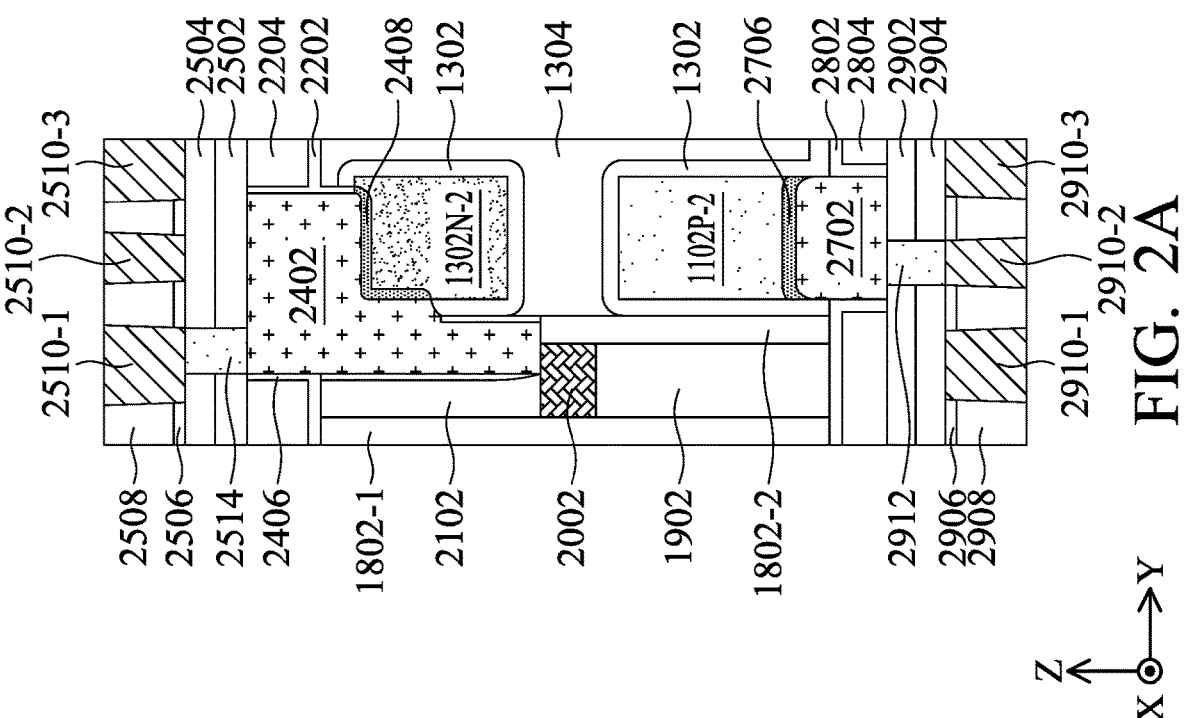

FIGS. 2A and 2B are Y-Z cross-sectional views of the workpiece 100 along the lines B-B' and C-C' of FIG. 1Q, respectively, in accordance with some embodiments of the present disclosure. The structures shown in FIGS. 2A and 2B are similar to the structures shown in FIGS. 1ZG-2 and 1ZG-3, except that the source/drain contacts 2402 and 2704 are respectively in contact with the sidewalls of the source/drain features 1302N-2 and 1102P-1. Specifically, in the formation of the contact openings for the source/drain contacts 2402 and 2704, such as the contact openings 2302 and 2604 discussed above, portions of the CESLs 1302 on the sidewalls of the source/drain features 1302N-2 and 1102P-1 may be removed, and then the sidewalls of the source/drain features 1302N-2 and 1102P-1 are exposed. As such, after the formation of the source/drain contacts 2402 and 2704, the source/drain contacts 2402 and 2704 are respectively in contact with the sidewalls of the source/drain features 1302N-2 and 1102P-1, as shown in FIGS. 2A and 2B. This enlarges the volumes of the source/drain contacts (the source/drain contacts 2402, 2704) and the contact areas between the source/drain contacts (the source/drain contacts 2402, 2704) and the source/drain features (the source/drain features 1302N-2, 1102P-1). Therefore, the resistance of the CFET 5000 may be reduced.

Figure 3B:
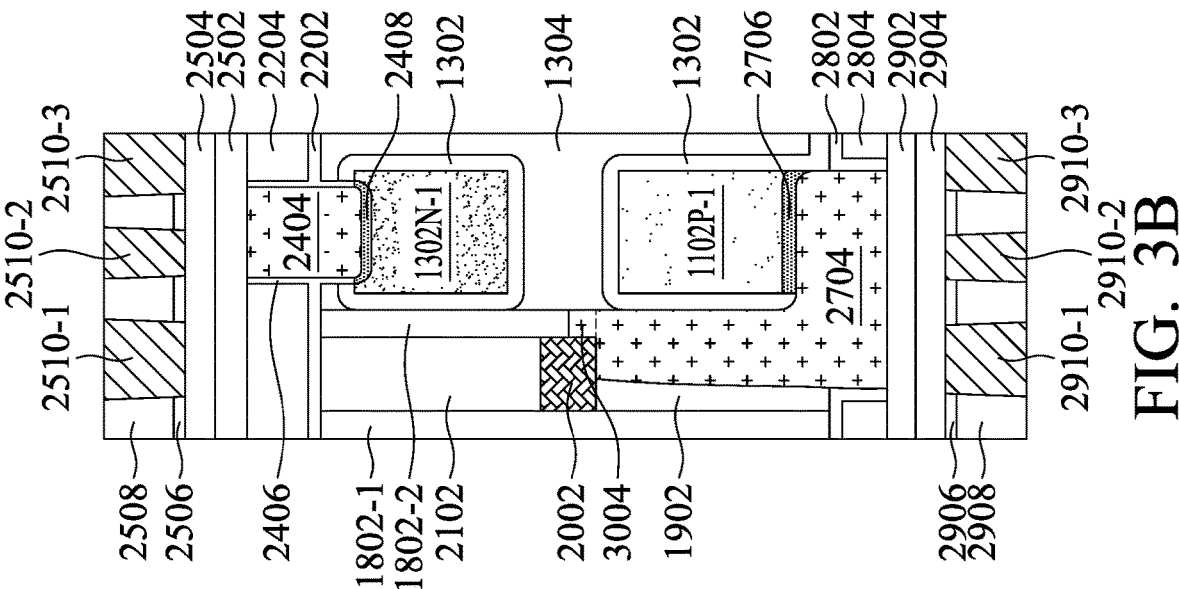
FIGS. 3A and 3B are Y-Z cross-sectional views of the workpiece along the lines B-B' and C-C' of FIG. 1Q, respectively, in accordance with some embodiments of the present disclosure.
Figure 3A:
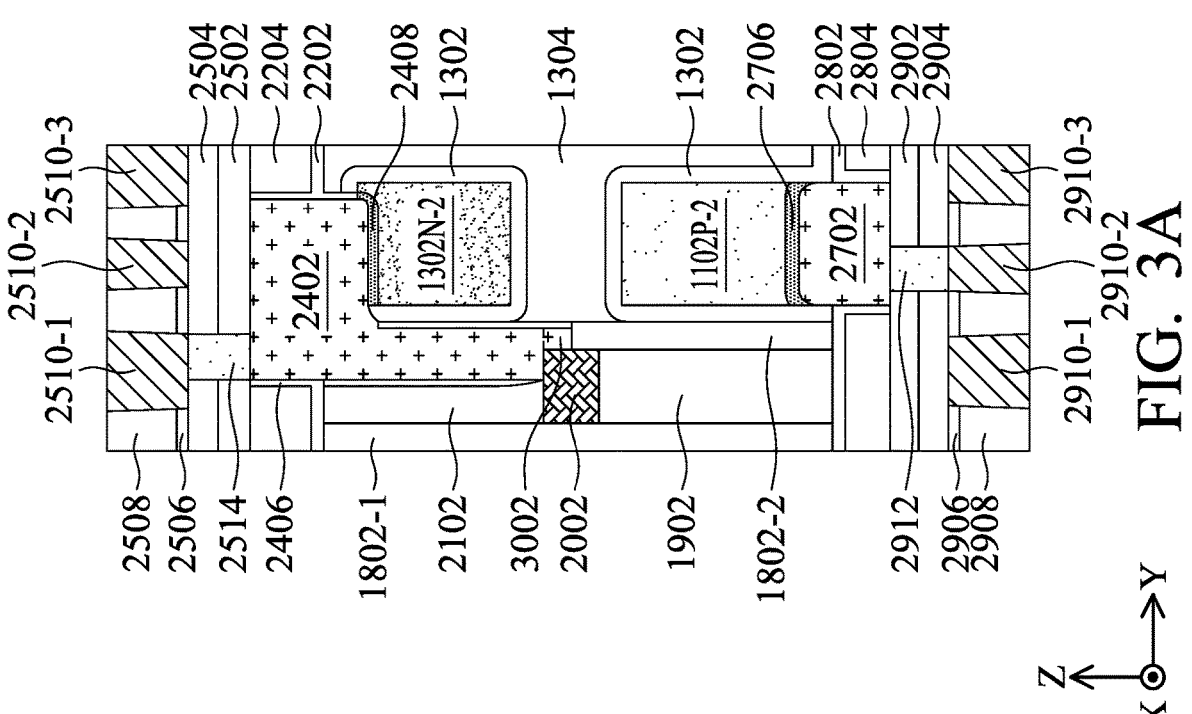

FIGS. 3A and 3B are Y-Z cross-sectional views of the workpiece 100 along the lines B-B' and C-C' of FIG. 1Q, respectively, in accordance with some embodiments of the present disclosure. The structures shown in FIGS. 3A and 3B are similar to the structures shown in FIGS. 1ZG-2 and 1ZG-3, except that the source/drain contacts 2402 and 2704 are respectively in contact with the sidewalls of the metal rail 2002. Specifically, in the formation of the contact openings for the source/drain contacts 2402 and 2704, such as the contact openings 2302 and 2604 discussed above, portions of the sidewall layer 1802-2 on the sidewall of the metal rail 2002 may be removed, and then the sidewall of the metal rail 2002 are exposed. As such, after the formation of the source/drain contacts 2402 and 2704, the source/drain contacts 2402 and 2704 respectively include extension portions 3002 and 3004 in contact with the sidewall of the metal rail 2002, as shown in FIGS. 3A and 3B. This enlarges the volumes of the source/drain contacts (the source/drain contacts 2402, 2704) and the contact areas between the source/drain contacts (the source/drain contacts 2402, 2704) and the metal rail 2002. Therefore, the resistance of the CFET 5000 may be reduced.

Figure 4B:
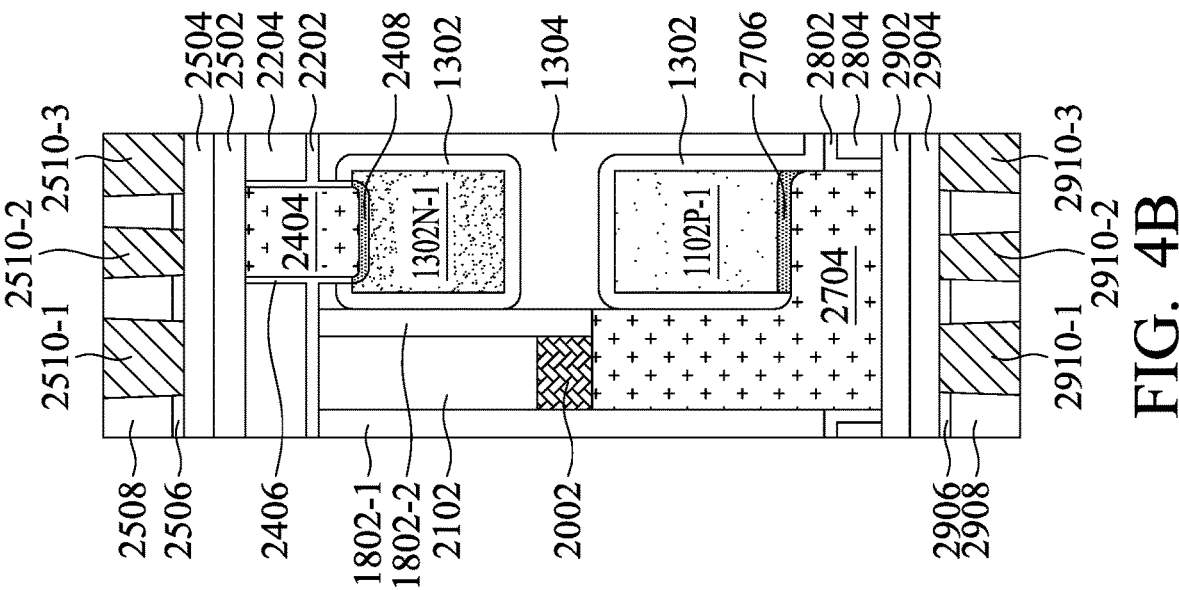
FIGS. 4A and 4B are Y-Z cross-sectional views of the workpiece along the lines B-B' and C-C' of FIG. 1Q, respectively, in accordance with some embodiments of the present disclosure.
Figure 4A:
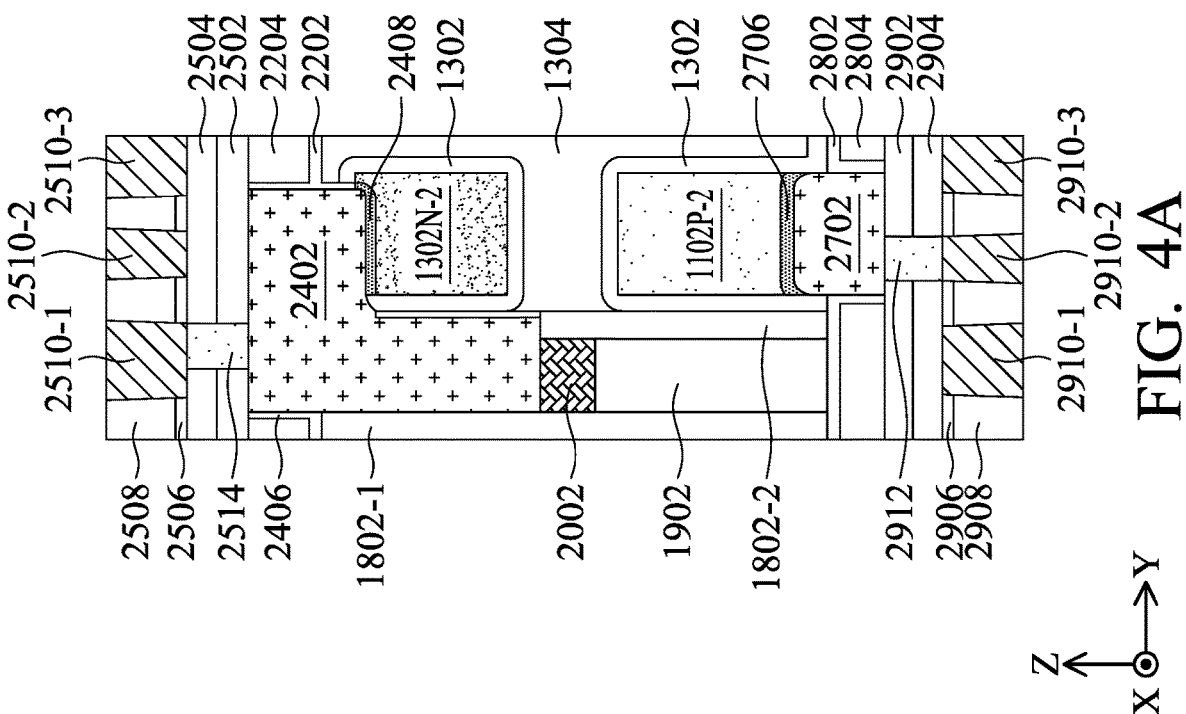

FIGS. 4A and 4B are Y-Z cross-sectional views of the workpiece 100 along the lines B-B' and C-C' of FIG. 1Q, respectively, in accordance with some embodiments of the present disclosure. The structures shown in FIGS. 4A and 4B are similar to the structures shown in FIGS. 1ZG-2 and 1ZG-3, except that the source/drain contacts 2402 and 2704 are in contact with the sidewall layers 1802-1 and 1802-2. Specifically, in the formation of the contact openings for the source/drain contacts 2402 and 2704, such as the contact openings 2302 and 2604 discussed above, portions of the dielectric layers 1902 and 2102 adjacent to the source/drain features 1302N-2 and 1102P-1 in the Y-direction may be removed, and then a sidewall of the sidewall layer 1802-1 are exposed. As such, after the formation of the source/drain contacts 2402 and 2704, the source/drain contacts 2402 and 2704 are respectively in contact with the sidewall layer 1802-2 and the sidewall of the sidewall layer 1802-1, as shown in FIGS. 4A and 4B. This enlarges the volumes of the source/drain contacts (the source/drain contacts 2402, 2704) and the contact areas between the source/drain contacts (the source/drain contacts 2402, 2704) and the metal rail 2002. Therefore, the resistance of the CFET 5000 may be reduced. It should be noted that the different embodiments shown in FIGS. 2A and 2B to 4A and 4B may be combined in any way.

FIG. 5 is an isometric view of the CFET 5000 formed from the workpiece 100, in accordance with some embodiments of the present disclosure. For the purpose of simplicity and clarity, the dielectric features and semiconductor layers 108 discussed above are omitted. As discussed above, the source/drain contact 2402 with the L-shape in the Y-Z cross-sectional view electrically connects the source/drain feature 1302N-2 to the metal rail 2002; and the source/drain contact 2704 with the L-shape in the Y-Z cross-sectional view electrically connects the source/drain feature 1102P-1 to the metal rail 2002. As such, the source/drain feature 1302N-2 is electrically connected to the source/drain feature 1102P-1 through the source/drain contact 2402, the metal rail 2002, and the source/drain contact 2704. Therefore, the resistance of the CFET 5000 is small, compared to use metal conductors in the front-side and back-side connection structures and a deep via for connecting the source/drain features. As show in FIG. 5, the metal rail 2002 is elongated in the X-direction and orthogonal to the gate structure 1506-2 in an X-Z cross-sectional view. This means that the area where the metal rail 2002 and the gate structure 1506-2 overlap is small. Therefore, the parasitic capacitance between the metal rail 2002 and the gate structure 1506-2 is small, compared to use a large metal plate for connecting the source/drain features.

Figure 6:
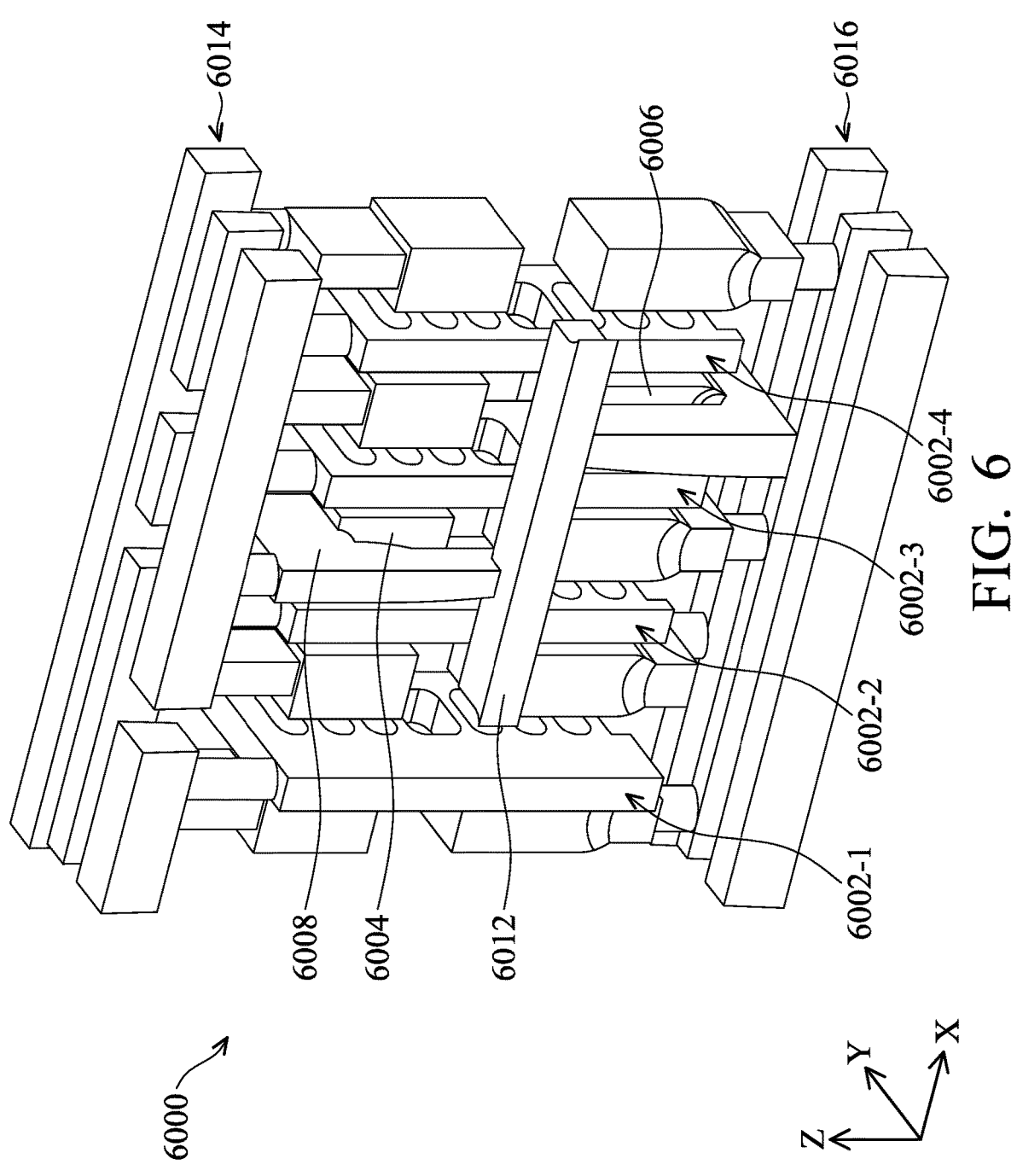
FIG. 6 is an isometric view of a circuit with CFETs, in accordance with some embodiments of the present disclosure.

FIG. 6 is an isometric view of a circuit 6000 with CFETs, in accordance with some embodiments of the present disclosure. The circuit 6000 is an AOI22D1 circuit with four CFETs 6002-1 to 6002-4 arranged in the X-direction. In other words, the circuit 6000 is constructed by four NFETs and four PFETs. As shown in FIG. 6, the structure of the CFET 6002-3 in the circuit 6000 is similar to structure of the CFET 5000 discussed above. More specifically, a source/drain feature 6004 and a source/drain feature 6006 are electrically connected to each other through a source/drain contact 6008, a metal rail 6012, a source/drain contact 6010, in which the source/drain contact 6008, the metal rail 6012, the source/drain contact 6010 are respectively similar to the source/drain contact 2402, the metal rail 2002, the source/drain contact 2704. The circuit 6000 further includes a front-side connection structure 6014 and a back-side connection structure 6016 including metal conductors and vias for interconnection of the circuit 6000. As such, the desired function of the AOI22D1 circuit is provided. Such structure of the AOI22D1 circuit may have lower circuit resistance and lower parasitic capacitance compared to other AOI22D1 circuits using large metal plate and/or deep via for connecting the source/drain features.

The embodiments disclosed herein relate to semiconductor structures and their manufacturing methods, and more particularly to semiconductor structures comprising the horizontal metal rail and L-shape source/drain contacts for connecting source/drain features of NFET and PFET in the CFET. Furthermore, the present embodiments provide one or more of the following advantages. The horizontal metal rail and L-shape source/drain contacts for connecting source/drain features of NFET and PFET in the CFET provides a lower circuit resistance and a lower parasitic capacitance, which improves the performance of the CFET, such as RC delay.

Thus, one of the embodiments of the present disclosure describes a semiconductor structure that includes a first transistor, a second transistor, a metal rail, and a first source/drain contact and a second source/drain contact. The first transistor has a gate structure, a first source/drain feature, and a second source/drain feature. The first source/drain feature and the second source/drain feature are on opposite sides of the gate structure. The second transistor has the gate structure, a third source/drain feature directly over the first source/drain feature, and a fourth source/drain feature directly over the second source/drain feature. The metal rail extends in an X-direction and adjacent to the gate structure in a Y-direction. The first source/drain contact and the second source/drain contact each has an L-shape in a Y-Z cross-sectional view. The first source/drain contact electrically connects the first source/drain feature to the metal rail. The second source/drain contact electrically connects the fourth source/drain feature to the metal rail.

In some embodiments, a top surface of metal rail is lower than bottom surfaces of the third source/drain feature and the fourth source/drain feature.

In some embodiments, the semiconductor structure further includes contact etch stop layers on sidewalls of the first source/drain feature and the fourth source/drain feature to respectively separate the first source/drain contact and the second source/drain contact from the sidewalls of the first source/drain feature and the fourth source/drain feature.

In some embodiments, the first source/drain contact and the second source/drain contact are respectively in contact with sidewalls of the first source/drain feature and the fourth source/drain feature.

In some embodiments, the first source/drain contact and the second source/drain contact each includes an extension portion in contact with a sidewall of the meal rail.

In some embodiments, the semiconductor structure further includes a sidewall layer between the gate structure and the metal rail in the Y-direction.

In some embodiments, a width of the sidewall layer in the Y-direction is in a range from about 5 nm to about 20 nm.

In some embodiments, the semiconductor structure further includes a dielectric layer adjacent to the gate structure in the Y-direction. A top surface of the dielectric layer is in contact with a bottom surface of the metal rail and higher than top surfaces of the first source/drain feature and the second source/drain feature.

In some embodiments, a thickness of the metal rail is in a range from about 10 nm to about 50 nm.

In another of the embodiments, discussed is a semiconductor structure including first nanostructures, second nanostructures, a gate structure, a first source/drain feature, a second source/drain feature, a metal rail, and a first source/drain contact and a second source/drain contact. The first nanostructures are stacked over each other in a Z-direction. The second nanostructures directly over the first nanostructures and stacked over each other in the Z-direction. The gate structure wraps around the first nanostructures and the second nanostructures. The first source/drain feature is connected to the first nanostructures. The second source/drain feature is connected to the second nanostructures. The first source/drain feature and the second source/drain feature are on opposite sides of the gate structure. The metal rail extends in the X-direction and adjacent to the gate structure in a Y-direction. The first source/drain contact and the second source/drain contact each has an L-shape in a Y-Z cross-sectional view. The first source/drain contact electrically connects the first source/drain feature to the metal rail, wherein the second source/drain contact electrically connects the second source/drain feature to the metal rail.

In some embodiments, the semiconductor structure further includes a dielectric layer between the first nanostructures and the second nanostructures, wherein the dielectric layer is thicker than the first nanostructures and the second nanostructures.

In some embodiments, a bottom surface of the metal rail is higher than a topmost surface of the first nanostructures, and a top surface of the metal rail is lower than a bottommost surface of the second nanostructures.

In some embodiments, the first source/drain contact and the second source/drain contact are separated from sidewalls of the first source/drain feature and the second source/drain feature.

In some embodiments, the semiconductor structure further includes two sidewall layers in contact with sidewalls of the metal rail in the Y-direction.

In some embodiments, the first source/drain contact and the second source/drain contact are in contact with the two sidewall layers.

In some embodiments, a width of the metal rail in the Y-direction is in a range from about 10 nm to about 40 nm.

In yet another of the embodiments, discussed is a method for manufacturing a semiconductor structure that includes forming a fin over a substrate. The fin includes first semiconductor layers and second semiconductor layers alternately stacked, The method further includes forming a dummy gate structure over the fin, forming a first source/drain feature and a second source/drain feature on opposite sides of the dummy gate structure in an X-direction, forming a third source/drain feature and a fourth source/drain feature directly over the first source/drain feature and the second source/drain feature, respectively, removing the dummy gate structure and the first semiconductor layers in the fin to form a gate trench, forming a gate structure in the gate trench to wrap around the second semiconductor layers, forming a metal rail extending in the X-direction and spaced apart from the gate structure in a Y-direction, and forming a first source/drain contact and a second source/drain contact each having an L-shape in a Y-Z cross-sectional view. The first source/drain contact electrically connects the first source/drain feature to the metal rail. The second source/drain contact electrically connects the fourth source/drain feature to the metal rail.

In some embodiments, the method further includes recessing the gate structure to form an opening adjacent to the gate structure, the first source/drain feature, the second source/drain feature, the third source/drain feature, and the fourth source/drain feature in the Y-direction; forming sidewall layers on sidewalls of the opening in the Y-direction; forming a first dielectric layer in the opening; forming the metal rail in the opening, wherein a bottom surface of the metal rail is higher than the first source/drain feature and the second source/drain feature, and a top surface of the metal rail is lower than the third source/drain feature and the fourth source/drain feature; and forming a second dielectric layer in the opening and over the metal rail.

In some embodiments, the formation of the first source/drain contact includes forming a third dielectric layer over the second dielectric layer, the third source/drain feature, and the fourth source/drain feature; recessing the second dielectric layer and the third dielectric layer to form a contact opening exposing the top surface of the metal rail; and forming a conductive material in the contact opening to form the first source/drain contact.

In some embodiments, the formation of the second source/drain contact includes recessing the first dielectric layer and the substrate to form a contact opening exposing the bottom surface of the metal rail; forming a conductive material in the contact opening to form the second source/drain contact; and removing the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first transistor having a gate structure, a first source/drain feature, and a second source/drain feature, wherein the first source/drain feature and the second source/drain feature are on opposite sides of the gate structure;
a second transistor having the gate structure, a third source/drain feature directly over the first source/drain feature, and a fourth source/drain feature directly over the second source/drain feature;
a metal rail extending in an X-direction and adjacent to the gate structure in a Y-direction; and
a first source/drain contact and a second source/drain contact each having an L-shape in a Y-Z cross-sectional view, wherein the first source/drain contact electrically connects the first source/drain feature to the metal rail, wherein the second source/drain contact electrically connects the fourth source/drain feature to the metal rail.

2. The semiconductor structure of claim 1, wherein a top surface of the metal rail is lower than bottom surfaces of the third source/drain feature and the fourth source/drain feature.

3. The semiconductor structure of claim 1, further comprising:
contact etch stop layers on sidewalls of the first source/drain feature and the fourth source/drain feature to respectively separate the first source/drain contact and the second source/drain contact from the sidewalls of the first source/drain feature and the fourth source/drain feature.

4. The semiconductor structure of claim 1, wherein the first source/drain contact and the second source/drain contact are respectively in contact with sidewalls of the first source/drain feature and the fourth source/drain feature.

5. The semiconductor structure of claim 1, wherein the first source/drain contact and the second source/drain contact each comprises:
an extension portion in contact with a sidewall of the metal rail.

6. The semiconductor structure of claim 1, further comprising:
a sidewall layer between the gate structure and the metal rail in the Y-direction.

7. The semiconductor structure of claim 6, wherein a width of the sidewall layer in the Y-direction is in a range from 5 nm to 20 nm.

8. The semiconductor structure of claim 1, further comprising:
a dielectric layer adjacent to the gate structure in the Y-direction, wherein a top surface of the dielectric layer is in contact with a bottom surface of the metal rail and higher than top surfaces of the first source/drain feature and the second source/drain feature.

9. The semiconductor structure of claim 1, wherein a thickness of the metal rail is in a range from 10 nm to 50 nm.

10. A semiconductor structure, comprising:
first nanostructures stacked over each other in a Z-direction;
second nanostructures directly over the first nanostructures and stacked over each other in the Z-direction;
a gate structure wrapping around the first nanostructures and the second nanostructures;
a first source/drain feature connected to the first nanostructures;
a second source/drain feature connected to the second nanostructures, wherein the first source/drain feature and the second source/drain feature are on opposite sides of the gate structure;
a metal rail extending in an X-direction and adjacent to the gate structure in a Y-direction; and
a first source/drain contact and a second source/drain contact each having an L-shape in a Y-Z cross-sectional view, wherein the first source/drain contact electrically connects the first source/drain feature to the metal rail, wherein the second source/drain contact electrically connects the second source/drain feature to the metal rail.

11. The semiconductor structure of claim 10, further comprising:
a dielectric layer between the first nanostructures and the second nanostructures, wherein the dielectric layer is thicker than the first nanostructures and the second nanostructures.

12. The semiconductor structure of claim 10, wherein a bottom surface of the metal rail is higher than a topmost surface of the first nanostructures, and a top surface of the metal rail is lower than a bottommost surface of the second nanostructures.

13. The semiconductor structure of claim 10, wherein the first source/drain contact and the second source/drain contact are separated from sidewalls of the first source/drain feature and the second source/drain feature.

14. The semiconductor structure of claim 10, further comprising:
two sidewall layers in contact with sidewalls of the metal rail in the Y-direction.

15. The semiconductor structure of claim 14, wherein the first source/drain contact and the second source/drain contact are in contact with the two sidewall layers.

16. The semiconductor structure of claim 10, wherein a width of the metal rail in the Y-direction is in a range from 10 nm to 40 nm.

17. A semiconductor structure, comprising:

first nanostructures stacked over each other;

second nanostructures over the first nanostructures and stacked over each other;

a gate structure wrapping around the first nanostructures and the second nanostructures;

a first source/drain feature and a second source/drain feature attached to the first nanostructures in a first direction;

a third source/drain feature and a fourth source/drain feature attached to the second nanostructures in the first direction, wherein the third source/drain feature is over the first source/drain feature and the fourth source/drain feature is over the second source/drain feature;

a metal rail extending in the first direction and adjacent to the gate structure in a second direction perpendicular to the first direction;

a first source/drain contact over the third source/drain feature and the metal rail; and a second source/drain contact under the second source/drain feature and the metal rail, wherein the first source/drain contact electrically connects the third source/drain feature to the metal rail, wherein the second source/drain contact electrically connects the second source/drain feature to the metal rail.

18. The semiconductor structure of claim 17, wherein a bottom surface of the metal rail is higher than the first source/drain feature and the second source/drain feature, and a top surface of the metal rail is lower than the third source/drain feature and the fourth source/drain feature.

19. The semiconductor structure of claim 17, further comprising:

sidewall layers on opposite sides of the metal rail in the second direction, wherein the first source/drain contact interfaces a top surface of the sidewall layers and the second source/drain contact interfaces a bottom surface of the sidewall layers.

20. The semiconductor structure of claim 17, wherein a bottommost surface of the first source/drain contact is lower than a top surface of the metal rail and a topmost surface of the second source/drain contact is higher than a bottom surface of the metal rail.

* * * * *